(12) United States Patent
Yamazaki

(10) Patent No.: US 8,569,119 B2
(45) Date of Patent: Oct. 29, 2013

(54) METHOD FOR PRODUCING SEMICONDUCTOR DEVICE AND DISPLAY DEVICE

(75) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 273 days.

(21) Appl. No.: 12/963,211

(22) Filed: Dec. 8, 2010

(65) Prior Publication Data

US 2011/0086569 A1 Apr. 14, 2011

Related U.S. Application Data

(62) Division of application No. 10/772,586, filed on Feb. 6, 2004, now Pat. No. 7,858,453.

(30) Foreign Application Priority Data

Feb. 6, 2003 (JP) .................................. 2003-028952
Feb. 6, 2003 (JP) .................................. 2003-029012

(51) Int. Cl.
*H01L 21/00* (2006.01)

(52) U.S. Cl.
USPC ..... 438/151; 438/674; 438/597; 257/E21.001

(58) Field of Classification Search
USPC ........... 438/151, 597, 674, 689; 257/E21.001
See application file for complete search history.

(56) References Cited

U.S. PATENT DOCUMENTS

| 4,328,257 | A | 5/1982 | Muehlberger et al. |
| 5,228,940 | A | 7/1993 | Yoneda |
| 5,238,523 | A | 8/1993 | Yuasa et al. |
| 5,292,401 | A | 3/1994 | Yoneda |
| 5,429,994 | A | 7/1995 | Ishikawa |
| 5,483,082 | A | 1/1996 | Takizawa et al. |
| 5,549,780 | A | 8/1996 | Koinuma et al. |
| 5,563,095 | A | 10/1996 | Frey |
| 5,580,796 | A | 12/1996 | Takizawa et al. |
| 5,679,167 | A | 10/1997 | Muehlberger |
| 5,824,361 | A | 10/1998 | Asanuma |
| 6,019,850 | A | 2/2000 | Frey |
| 6,051,150 | A | 4/2000 | Miyakawa |

(Continued)

FOREIGN PATENT DOCUMENTS

| EP | 0 930 641 A2 | 7/1999 |
| EP | 0 931 655 A1 | 7/1999 |

(Continued)

OTHER PUBLICATIONS

International Search Report (Application No. PCT/JP2004/000895) dated Apr. 27, 2004.

(Continued)

*Primary Examiner* — Thanh Nguyen

(74) *Attorney, Agent, or Firm* — Nixon Peabody LLP; Jeffrey L. Costellia

(57) ABSTRACT

A step of forming wiring using first solution ejection means for ejecting a conductive material, a step of forming a resist mask on the wiring using second solution ejection means, and a step of etching the wiring using an atmospheric-pressure plasma device having linear plasma generation means or an atmospheric-pressure plasma device having a plurality of linearly-arranged plasma-generation-means using the resist mask as a mask are included.

14 Claims, 23 Drawing Sheets

(56) References Cited

U.S. PATENT DOCUMENTS

| | | |
|---|---|---|
| 6,118,502 A | 9/2000 | Yamazaki et al. |
| 6,203,619 B1 | 3/2001 | McMillan |
| 6,228,465 B1 | 5/2001 | Takiguchi et al. |
| 6,231,917 B1 | 5/2001 | Ito et al. |
| 6,293,222 B1 | 9/2001 | Paquet et al. |
| 6,312,502 B1 | 11/2001 | Li et al. |
| 6,361,145 B1 | 3/2002 | Ishimatsu et al. |
| 6,372,285 B2 | 4/2002 | Ito et al. |
| 6,382,771 B1 | 5/2002 | Ikeda |
| 6,416,583 B1 | 7/2002 | Kitano et al. |
| 6,424,091 B1 | 7/2002 | Sawada et al. |
| 6,429,400 B1 | 8/2002 | Sawada et al. |
| 6,599,582 B2 | 7/2003 | Kiguchi et al. |
| 6,627,263 B2 | 9/2003 | Kitano et al. |
| 6,660,091 B2 | 12/2003 | Ito et al. |
| 6,660,545 B2 | 12/2003 | Furusawa |
| 6,756,324 B1 | 6/2004 | Gates |
| 6,767,473 B2 | 7/2004 | Fujita et al. |
| 6,776,880 B1 | 8/2004 | Yamazaki |
| 6,782,928 B2 | 8/2004 | Kweon et al. |
| 6,808,749 B2 | 10/2004 | Morii et al. |
| 6,821,379 B2 | 11/2004 | Datta et al. |
| 6,871,943 B2 | 3/2005 | Ogawa |
| 6,877,853 B2 | 4/2005 | Kiguchi et al. |
| 6,885,032 B2 | 4/2005 | Forbes et al. |
| 6,909,477 B1 | 6/2005 | Yi et al. |
| 6,973,710 B2 | 12/2005 | Kiguchi et al. |
| 7,033,444 B1 | 4/2006 | Komino et al. |
| 7,114,802 B2 | 10/2006 | Kiguchi et al. |
| 7,115,434 B2 | 10/2006 | Yamazaki et al. |
| 7,176,069 B2 | 2/2007 | Yamazaki et al. |
| 7,189,654 B2 | 3/2007 | Yamazaki et al. |
| 7,501,147 B2 | 3/2009 | Machida |
| 7,510,893 B2 * | 3/2009 | Yamazaki et al. ............... 438/30 |
| 7,625,493 B2 * | 12/2009 | Yamazaki ........................ 216/4 |
| 7,858,453 B2 * | 12/2010 | Yamazaki ..................... 438/151 |
| 2001/0002331 A1 | 5/2001 | Miyata |
| 2001/0003601 A1 | 6/2001 | Ueda et al. |
| 2001/0004190 A1 | 6/2001 | Nishi et al. |
| 2001/0027013 A1 | 10/2001 | Tsutsui |
| 2002/0022364 A1 | 2/2002 | Hatta et al. |
| 2002/0050599 A1 | 5/2002 | Lee et al. |
| 2002/0067400 A1 | 6/2002 | Kawase et al. |
| 2002/0105080 A1 | 8/2002 | Speakman |
| 2002/0109143 A1 | 8/2002 | Inoue |
| 2002/0128515 A1 | 9/2002 | Ishida et al. |
| 2002/0151171 A1 | 10/2002 | Furusawa |
| 2003/0054653 A1 | 3/2003 | Yamamzaki et al. |
| 2003/0059975 A1 | 3/2003 | Sirringhaus et al. |
| 2003/0059984 A1 | 3/2003 | Sirringhaus et al. |
| 2003/0059987 A1 | 3/2003 | Sirringhaus et al. |
| 2003/0060038 A1 | 3/2003 | Sirringhaus et al. |
| 2003/0132987 A1 | 7/2003 | Ogawa |
| 2003/0177639 A1 | 9/2003 | Berg |
| 2004/0050685 A1 | 3/2004 | Yara et al. |
| 2004/0075396 A1 | 4/2004 | Okumura et al. |
| 2004/0224433 A1 | 11/2004 | Yamazaki et al. |
| 2004/0253896 A1 | 12/2004 | Yamazaki |
| 2004/0266073 A1 | 12/2004 | Yamazaki |
| 2005/0011752 A1 | 1/2005 | Yamazaki et al. |
| 2005/0013927 A1 | 1/2005 | Yamazaki |
| 2005/0064091 A1 | 3/2005 | Yamazaki |
| 2005/0090029 A1 | 4/2005 | Yamazaki et al. |
| 2005/0158456 A1 | 7/2005 | Kiguchi et al. |
| 2005/0167404 A1 | 8/2005 | Yamazaki |
| 2007/0015323 A1 | 1/2007 | Isobe et al. |
| 2007/0167023 A1 | 7/2007 | Yamazaki et al. |
| 2007/0172972 A1 | 7/2007 | Yamazaki et al. |
| 2008/0206915 A1 | 8/2008 | Yamazaki |

FOREIGN PATENT DOCUMENTS

| | | |
|---|---|---|
| EP | 1 205 964 A1 | 5/2002 |
| EP | 1 253 626 A2 | 10/2002 |
| EP | 1 340 838 | 9/2003 |
| EP | 1 416 555 A1 | 5/2004 |
| EP | 1 804 321 A1 | 7/2007 |
| JP | 59-090966 | 5/1984 |
| JP | 06-202153 | 7/1994 |
| JP | 06-327924 | 11/1994 |
| JP | 07-024579 | 1/1995 |
| JP | 08-203868 | 8/1996 |
| JP | 09-320363 | 12/1997 |
| JP | 10-062814 | 3/1998 |
| JP | 11-168042 | 6/1999 |
| JP | 11-204529 | 7/1999 |
| JP | 11-274671 | 10/1999 |
| JP | 11-277746 | 10/1999 |
| JP | 11-340129 | 12/1999 |
| JP | 2000-025238 | 1/2000 |
| JP | 2000-079366 | 3/2000 |
| JP | 2000-135467 | 5/2000 |
| JP | 2000-157899 | 6/2000 |
| JP | 2000-169977 | 6/2000 |
| JP | 2000-188251 | 7/2000 |
| JP | 2000-258921 | 9/2000 |
| JP | 2000-328269 | 11/2000 |
| JP | 2001-068827 | 3/2001 |
| JP | 2001-093871 | 4/2001 |
| JP | 2001-179167 | 7/2001 |
| JP | 2001-209073 | 8/2001 |
| JP | 2001-210646 | 8/2001 |
| JP | 2002-066391 | 3/2002 |
| JP | 2002-096474 | 4/2002 |
| JP | 2002-151478 | 5/2002 |
| JP | 2002-151480 | 5/2002 |
| JP | 2002-237463 | 8/2002 |
| JP | 2002-237480 | 8/2002 |
| JP | 2002-261048 | 9/2002 |
| JP | 2002-289864 | 10/2002 |
| JP | 2002-324966 | 11/2002 |
| JP | 2002-359246 | 12/2002 |
| JP | 2002-359347 | 12/2002 |
| JP | 2002-367774 | 12/2002 |
| JP | 2003-010755 | 1/2003 |
| JP | 2003-017413 | 1/2003 |
| JP | 2003-031234 | 1/2003 |
| JP | 2003-126760 | 5/2003 |
| JP | 2003-192499 | 7/2003 |
| JP | 2003-212685 | 7/2003 |
| JP | 2003-212686 | 7/2003 |
| JP | 2003-238286 | 8/2003 |
| JP | 2003-311197 | 11/2003 |
| JP | 2003-347284 | 12/2003 |
| KR | 94-010505 B1 | 10/1994 |
| KR | 2002-0022072 A | 3/2002 |
| WO | WO-01-47044 | 6/2001 |
| WO | WO-02-40742 | 5/2002 |
| WO | WO-2004/070809 | 8/2004 |
| WO | WO-2004/070810 | 8/2004 |
| WO | WO-2004/070811 | 8/2004 |
| WO | WO-2004/070819 | 8/2004 |
| WO | WO-2004/070820 | 8/2004 |
| WO | WO-2004/070821 | 8/2004 |
| WO | WO 2004-070823 | 8/2004 |

OTHER PUBLICATIONS

International Search Report (Application No. PCT/JP2004/000897) dated Apr. 27, 2004.
International Search Report (Application No. PCT/JP2004/000899) dated Apr. 27, 2004.
International Search Report (Application No. PCT/JP2004/000900) dated Jun. 1, 2004.
International Search Report (Application No. PCT/JP2004/000915) dated Apr. 27, 2004.
International Search Report (Application No. PCT/JP2004/000918) dated Apr. 27, 2004.
International Search Report (Application No. PCT/JP2004/000930) dated Apr. 13, 2004.
International Search Report (Application No. PCT/JP2004/000932) dated Apr. 6, 2004.

(56) References Cited

OTHER PUBLICATIONS

S. Wolf et al. "*Silicon Processing for the VLSI ERA*" vol. 1 (Process Technology), pp. 198, 408, 427, 539, 542, 535; Jan. 1, 1986.

Korean Office Action, Application No. 2011-7300130 (PCTKR06954/6955D1), Korean Intellectual Property Office, Apr. 11, 2011.

* cited by examiner

METHOD FOR PRODUCING SEMICONDUCTOR DEVICE AND DISPLAY DEVICE

TECHNICAL FIELD

The invention relates to a method for producing a semiconductor device, particularly relates to a method for producing a display device using an insulated gate field effect transistor as represented by a thin-film transistor (TFT).

BACKGROUND ART

The thin-film transistor (TFT) formed using a thin film on an insulating surface is widely used in an integrated circuit and the like. In particular, the thin-film transistor is often used as a switching element in a display panel of a thin display device as represented by a liquid crystal TV and the like, and an application of the thin-film transistor is expanding to be used for a portable terminal, a large display device, and the like.

In a conventional display device using the TFT, a film is formed on an entire surface of a substrate, a pattern of the TFT and the like is formed using a photolithography process, an etching process, an ashing process, and the like. More than half of such production processes are likely to be performed in vacuum devices.

DISCLOSURE OF THE INVENTION

Problems that the Invention is to Solve

In a production process of the TFT, the film is processed using a method for removing most of the film (resist film, metal film, semiconductor film, organic film, and the like) formed on the entire surface of the substrate by etching using a resist mask formed by the photolithography. Therefore, a ratio of the film left on the substrate as wiring and the like has been only about several to several tens percent to the previously formed film. Furthermore, when the resist film and the like are formed by spin coating, about 95% of them has been wasted.

In this way, in the conventional production method of the TFT, most of materials are discarded as a result. Therefore, it has had an influence upon production cost of the display device and the like using the semiconductor device produced in this manner, in addition, caused increase in environmental burden.

Moreover, increase in screen size has caused increase in area of mother glass, accordingly caused increase in size of vacuum devices such as vacuum chamber or vacuum pump, resulting in unlimited scaling-up of manufacturing equipment. In addition, cost of the devices becomes high, therefore increased facility investment is required.

Such tendency has been more obvious with increase in size of substrate running through a production line.

Thus, it is an issue of the invention to propose a method for producing a display device in which cost of film formation material, or cost of materials used for the etching and ashing is reduced, and labor for vacuum process is also reduced.

Means for Solving the Problems

To solve the problem, the invention takes the following measures.

The method for producing the display device of the invention is characterized in that wiring is formed by ejecting a solution containing a conductive material to a material to he processed using solution ejection means.

Here, the wiring includes gate wiring, source wiring, and wiring connecting between the TFT and a pixel electrode.

Furthermore, it is acceptable that a resist mask is formed by depositing a resist film on the wiring, and that resist mask is used to process the wiring into a further fine pattern.

As means for depositing the resist film, solution ejection means containing a resist material can be used.

As means for etching the wiring, an atmospheric-pressure plasma device can be used.

Also, the atmospheric-pressure plasma device can be used as means for ashing the resist mask.

The invention is characterized by having a step of forming the wiring using first solution ejection means for ejecting the conductive material, a step of forming a resist mask on the wiring using second solution ejection means, and a step of etching the wiring using the atmospheric-pressure plasma device having linear plasma generation means using the resist mask as a mask.

Moreover, the invention is characterized by having a step of forming the wiring using the solution ejection means for ejecting the conductive material, a step of forming the resist mask at least on the wiring, and a step of etching the wiring using the atmospheric-pressure plasma device having the linear plasma generation means using the resist mask as the mask.

Further, the invention is characterized by having a step of forming the wiring, a step of forming the resist mask at least on the wiring using the solution ejection means, and a step of etching the wiring using the atmospheric-pressure plasma device having the linear plasma generation means using the resist mask as the mask.

The described configuration of the invention can be used in a method for producing a semiconductor device and a display device.

The atmospheric-pressure plasma device has the plasma generation means having a plasma nozzle extending in one way, and thus can generate the linear plasma.

Here, the atmospheric or near-atmospheric pressure is a pressure within a range of about 600 to 106000 Pa.

By using the semiconductor device produced as above, a display device that is needs only low cost and is inexpensive can be produced.

Another configuration of the invention is characterized by having a step of forming the wiring using the first solution ejection means for ejecting the conductive material, a step of forming the resist mask on the wiring using the second solution ejection means. and a step of etching the wiring using the atmospheric-pressure plasma device having a plurality of linearly-arranged plasma-generation-means using the resist mask as the mask.

Moreover, the invention is characterized by having a step of forming the wiring using the solution ejection means for ejecting the conductive material, a step of forming the resist mask at least on the wiring, and a step of etching the wiring using the atmospheric-pressure plasma device having the plurality of linearly-arranged plasma-generation-means using the resist mask as the mask.

Further, the invention is characterized by having a step of forming the wiring, a step of forming the resist mask at least on the wiring using the solution ejection means, and a step of etching the wiring using the atmospheric-pressure plasma device having the plurality of linearly-arranged plasma-generation-means using the resist mask as the mask.

The described configurations of the invention can be used in the method for producing the semiconductor device and the display device.

The atmospheric-pressure plasma device has the plurality of linearly-arranged plasma-generation-means, and thus can process any place on the material to be processed using particular plasma generation means that is selected from the plurality of plasma generation means.

Here, the atmospheric pressure or the near-atmospheric pressure is the pressure within the range of about 600 to 106000 Pa.

By using the semiconductor device produced as above, the display device that needs only low cost and is inexpensive can be produced.

Advantage of the Invention

By forming the film selectively using the solution ejection means, the amount of the films (resist film, metal film, semiconductor film, organic film, and the like) used, most of which has been conventionally wasted, is reduced thereby production cost can be reduced.

Furthermore, by forming the wiring and the like using a material having fluidity, coverage over a contact hole and a step is improved, and defects such as poor contact and disconnection of the wire can be reduced.

Also, the etching or the ashing is locally carried out using the linear plasma generation means, thereby an amount of gas used can be reduced, and thus the production cost can be reduced.

Also, by arranging the plurality of plasma generation means linearly, the etching or the ashing is selectively carried out, thereby the amount of the gas used can be reduced, and thus the production cost can be reduced.

Moreover, the etching or the ashing is processed at the atmospheric pressure or the near-atmospheric pressure, thereby the vacuum chamber and pump, and the like forming the device can be simplified, and increase in size of the device can be prevented. In addition, cost of device maintenance is reduced, and a treatment that has been conventionally performed after the chamber was evacuated into a vacuum state can be performed at the atmospheric pressure or the near-atmospheric pressure without the vacuum evacuation, therefore process time of the substrate can be reduced. Moreover, the facility investment cost (equipment cost) can be restrained, and thus reduction in cost of the facility investment becomes possible.

BEST MODE FOR CARRYING OUT THE INVENTION

Embodiments of the invention are described in detail using drawings. However, it will be easily understood for those skilled in the art that the invention is not limited to the following description, and the feature and detail can be variously altered without departing from the purpose and the scope of the invention. Therefore, the invention is not to be interpreted as limited to the following description of the embodiments.

(First Embodiment)

An embodiment of the invention is described using FIG. 1, FIG. 2(A), and FIG. 3 to FIG. 7.

Figure 1:
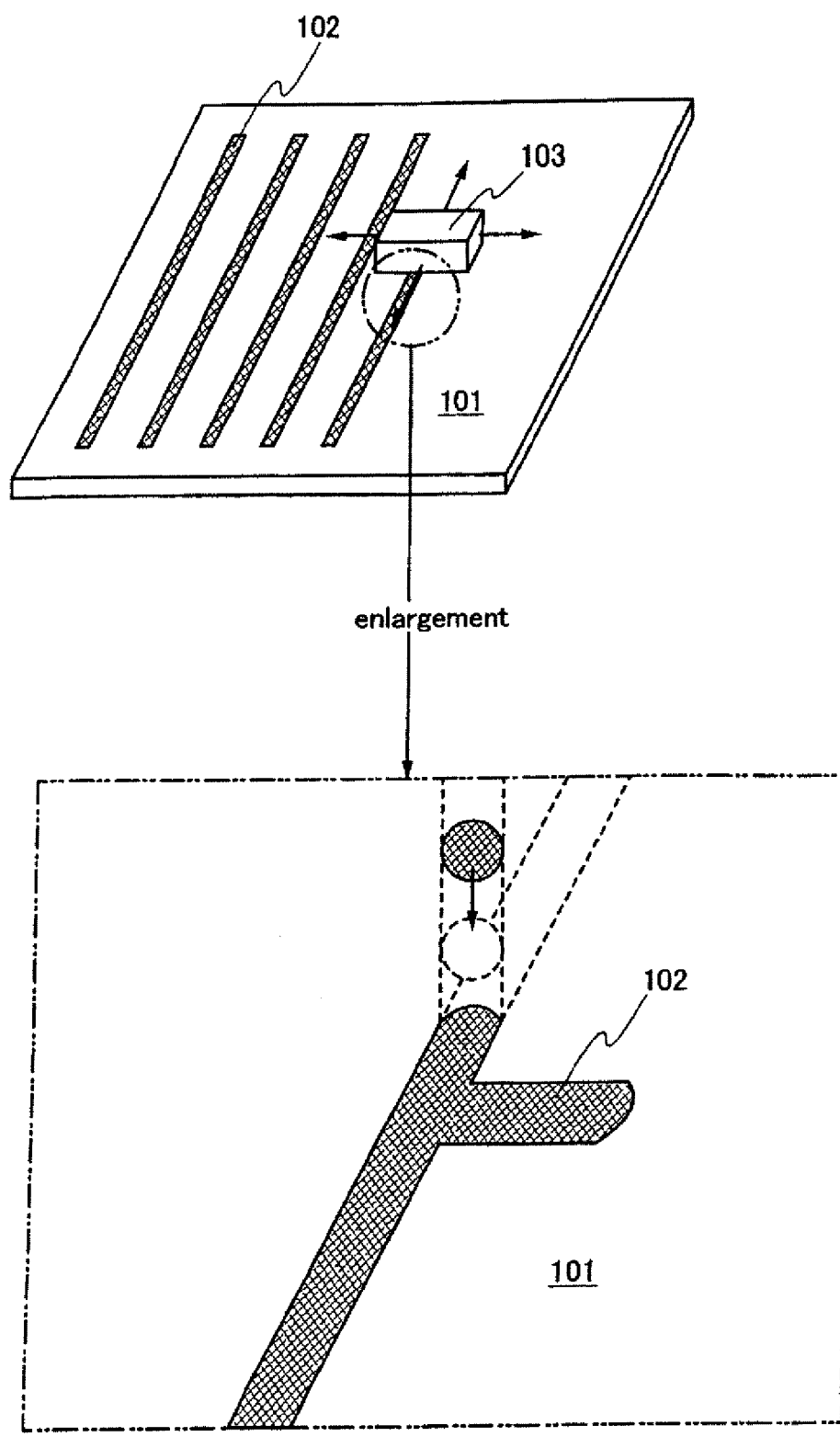
FIG. 1 is a perspective view illustrating a production method of the invention.

FIG. 1 shows a method for forming wiring using solution ejection means in the invention. The solution ejection means 103 moves above the substrate 101, ejects a solution on the substrate 101, and forms a wiring pattern 102.

FIG. 2(A) shows a method for etching using plasma generation means. In FIG. 2(A), the plasma generation means 202 moves above the substrate 101, and etches a portion that is not covered by a resist 201 in the wiring pattern 102.

In the embodiment, a method for producing a semiconductor device using the above method is described.

Various materials such as glass, quartz, semiconductor, plastic, metal, glass epoxy resin, ceramics, and the like may be formed into a substrate 301. Then, a known composite having conductivity is ejected on the substrate 301 using solution ejection means 306, thereby a gate electrode and wiring 302, and a capacitive electrode and wiring 303 are formed (FIG. 3(A)).

Then, the substrate, on which the gate electrode and wiring 302, and the capacitive electrode and wiring 303 have been formed, is subjected to heating treatment and the like, thereby solvent therein is volatilized so that viscosity of the composite is increased. The heating treatment can be performed for each formation of a thin film using the solution ejection method, or performed at each of optional processes, or performed collectively after all processes have completed.

Then, resists 304, 305 are ejected using the solution ejection means 306 such that the gate electrode and wiring 302 and the capacitive electrode and wiring 303, which are ejected in the above step, are covered (FIG. 3(B)).

Then, the resist is patterned (FIG. 3(C)).

Figure 4:
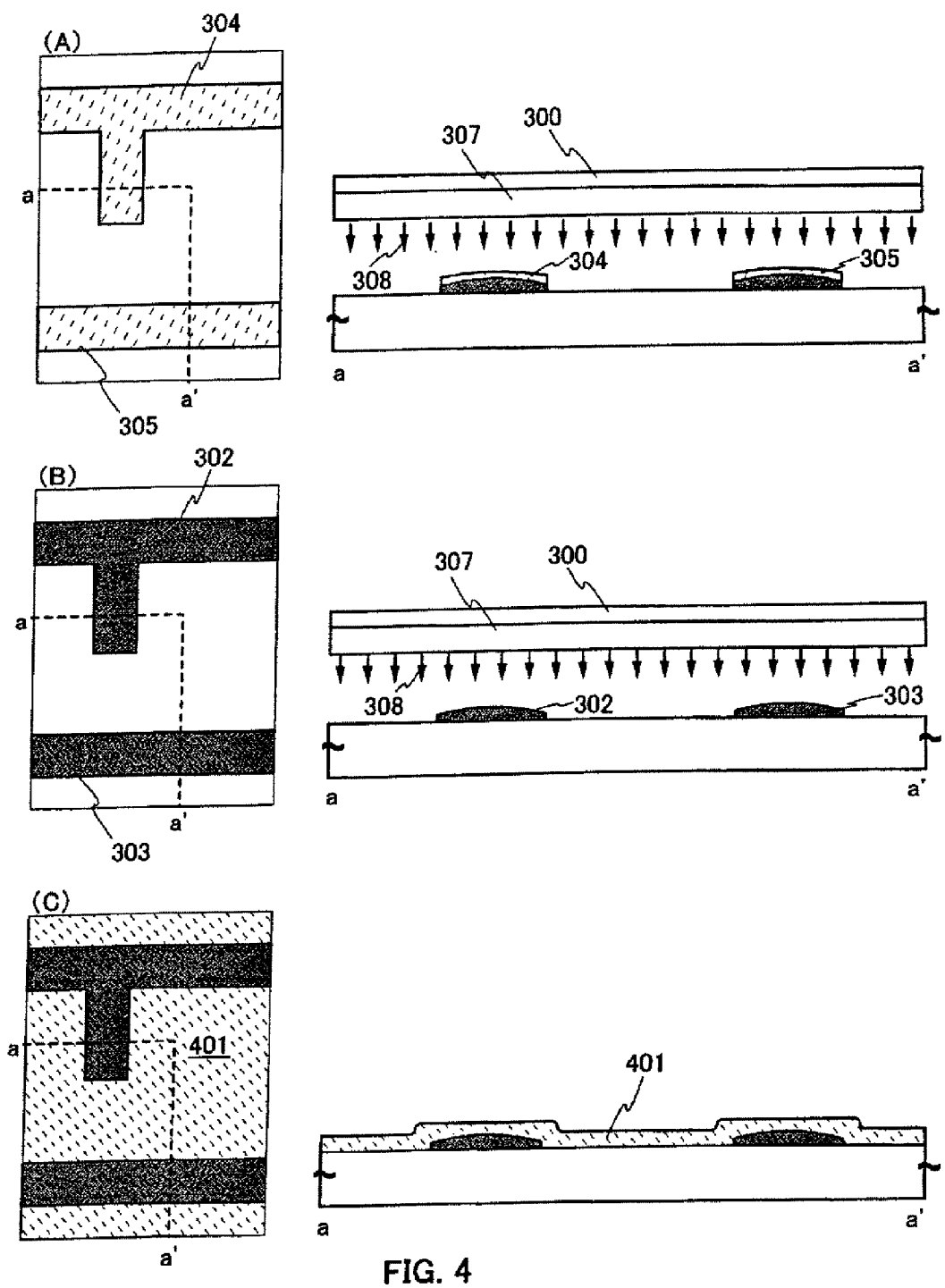
FIG. 4 is a view showing the method for producing the thin-film transistor of the invention.
Figure 5:
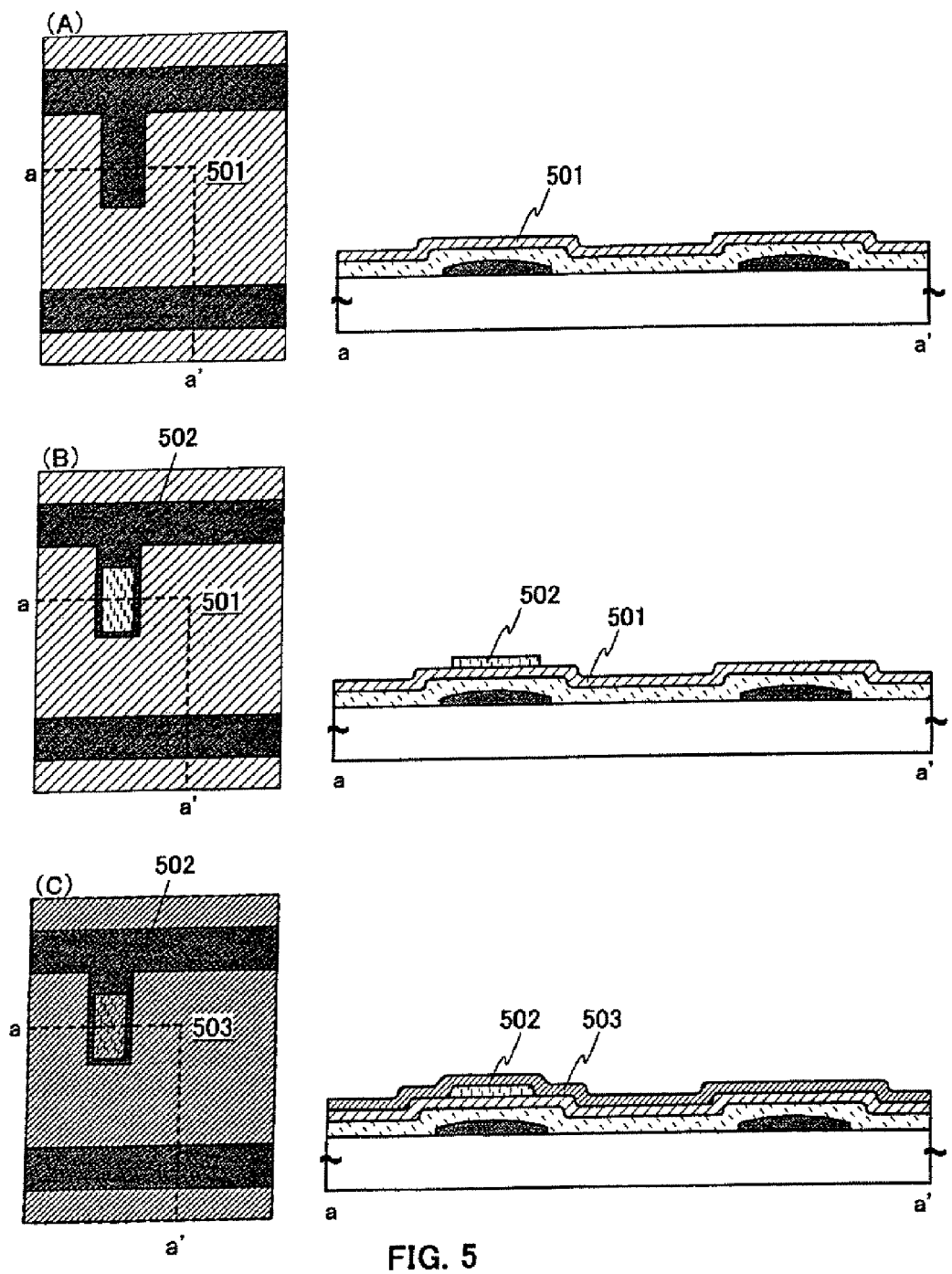
FIG. 5 is a view showing the method for producing the thin-film transistor of the invention.
Figure 6:
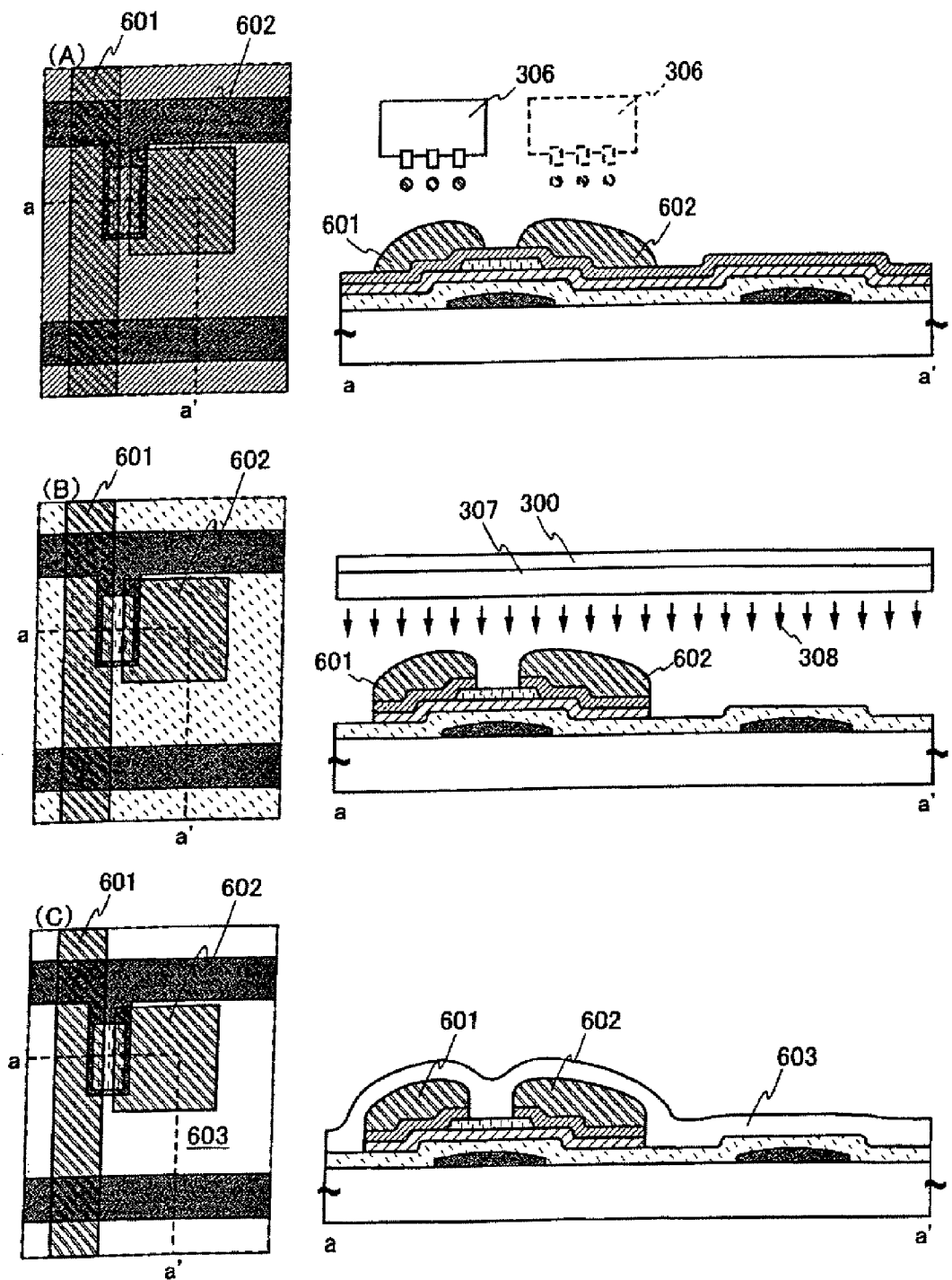
FIG. 6 is a view showing the method for producing the thin-film transistor of the invention.
Figure 7:
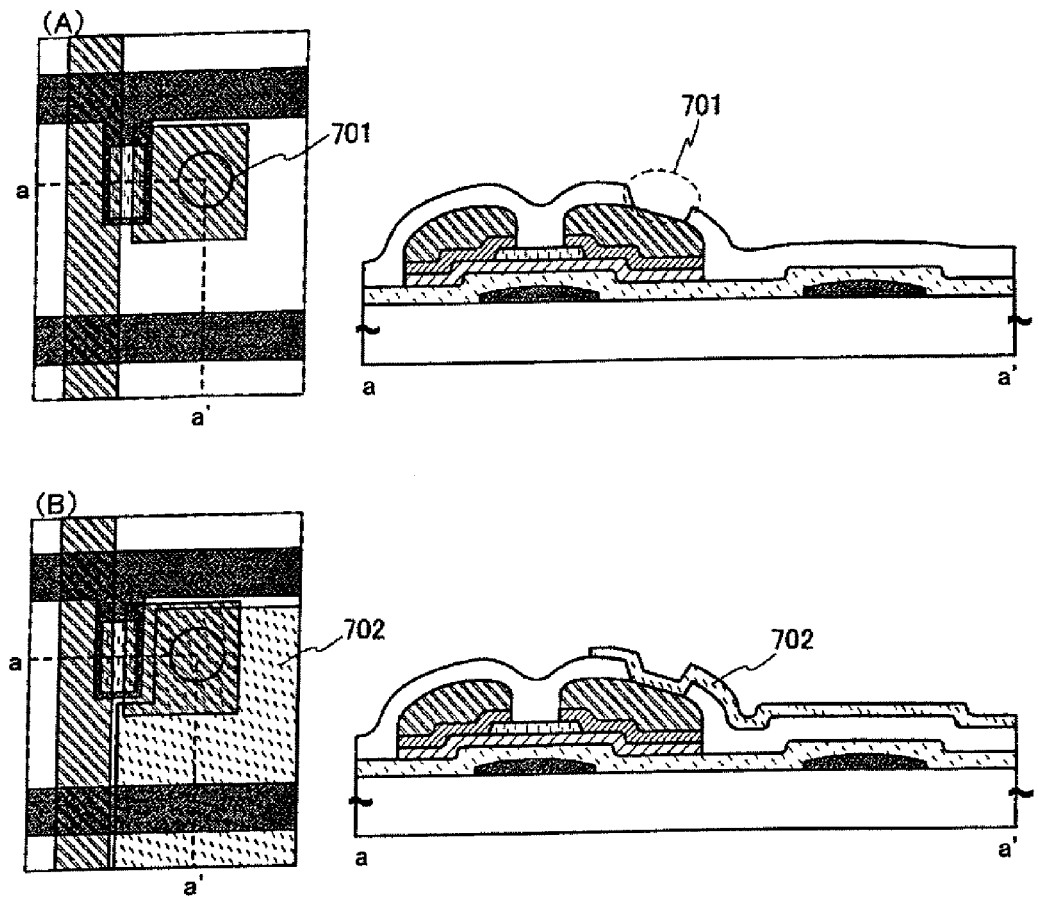
FIG. 7 is a view showing the method for producing the thin-film transistor of the invention.

Then, linear plasma 308 is generated using an atmospheric-pressure plasma device having linear plasma generation means 307 and a base 300, thereby the gate electrode and wiring 302. and the capacitive electrode and wiring 303 are etched, and then the resist is removed by the ashing (FIG. 4(A, B)).

According to the process as above, the gate electrode and wiring 302, and the capacitive electrode and wiring 303 are formed. As a material for forming the gate electrode and wiring 302, and the capacitive electrode and wiring 303, a conductive material such as Mo, Ti, Ta, W, Cr, Al, Cu, and Al containing Nd and the like is given, or a plurality of the conductive materials can be used in a stacked manner.

Then, a gate insulating film 401 is formed using a known method such as CVD method (FIG. 4(C)). Although a silicon nitride film is formed as the gate insulating film 401 using the CVD method at the atmospheric pressure in the embodiment, a silicon oxide film or a stacked structure of them can be also used.

Then, a semiconductor film 501 is deposited 25 to 80 nm (preferably 30 to 60 nm) in thickness using a known method (sputtering method, LPCVD method, plasma CVD method, and the like). An amorphous semiconductor film or a compound semiconductor film having an amorphous structure such as an amorphous silicon germanium film is used as the semiconductor film 501, and formed on an entire surface of the substrate 301 (FIG. 5(A)).

Then, a silicon nitride film is deposited on the entire surface and patterned, and thereby a channel protection film 502 is formed (FIG. 5(B)).

Then, a semiconductor film 503 doped with an impurity element imparting n-type is formed (FIG. 5(C)).

Then, source/drain electrodes and wiring 601, 602 are formed using the solution ejection means 306 (FIG. 6(A)). The source/drain electrodes and wiring 601, 602 can be patterned similarly to the gate electrode and wiring 302, and the capacitive electrode and wiring 303 shown in FIG. 3(A) to FIG. 4(B). As a material for forming the source/drain electrodes and wiring 601, 602, a conductive material such as Mo, Ti, Ta, W, Cr, Al, Cu, and Al containing Nd and the like is given, or a number of the conductive materials can be used in a stacked manner.

Then, using the source/drain electrodes and wiring 601, 602 as a mask, the linear plasma 308 is formed using the atmospheric-pressure plasma device having the linear-plasma generation means 307 and the base 300, thereby the semiconductor film 503 doped with the impurity element imparting the n-type and the semiconductor film 501 are etched.

Then, a protection film 603 is formed using a known method such as CVD method (FIG. 6(C)). Although the silicon nitride film is formed as the protection film 603 using the CVD method at the atmospheric pressure in the embodiment, the silicon oxide film or the stacked structure of them can be also used. An organic resin film such as an acrylic film can be also used.

Then, a resist is ejected using the solution ejection means 306, and then the resist is patterned. Then, the linear plasma 308 is formed using the atmospheric-pressure plasma device having the linear-plasma generation means 307 and the base 300, and then the protection film 603 is etched to foim a contact hole 701 (FIG. 7(A)).

Then, a pixel electrode 702 is formed using the solution ejection method.

The pixel electrode 702 may be directly formed using the solution ejection means 306, or may be patterned similarly to the gate electrode and wiring 302, and the capacitive electrode and wiring 303 shown in FIG. 3(A) to FIG. 4(B). As a material for forming the pixel electrode 702, a transparent conductive film such as ITO (indium oxide/tin oxide alloy), indium oxide/zinc oxide alloy ($In_2O_3$—ZnO), and zinc oxide (ZnO), or the conductive material such as Mo, Ti, Ta, W, Cr, Al, Cu, Al containing Nd and the like is given, or a plurality of the conductive materials can be used in the stacked manner.

The semiconductor device produced according to the embodiment is what is called the channel protection type where a channel formation region is protected by a protection film.

Although it is shown as an example in the embodiment that patterns of the wiring and the resist and the like are formed using the solution ejection method, and the etching and the ashing are carried out using the atmospheric pressure plasma having the linear plasma generation means, these may be performed in combination with various known methods for producing the TFT.

By selectively forming the patterns of the wiring and the resist and the like using the solution ejection means, the amount of the material used in production of a semiconductor device, most of which has been conventionally wasted, is reduced, thereby production cost of the display device using the semiconductor device can be reduced.

Furthermore, by forming the wiring and the like using a material having fluidity, the coverage over the contact hole and the step is improved, and the defects such as the bad contact and the breaking wire can be reduced.

Moreover, the etching or the ashing is locally carried out using the linear plasma generation means, thereby the amount of gas used can be also reduced, and thus the production cost can be reduced.

(Second Embodiment)

An embodiment of the invention is described using FIG. 1, FIG. 2, and FIG. 17 to FIG. 21.

FIG. 1 shows a method for forming the wiring using the solution ejection means in the invention. The solution ejection means 103 moves above the substrate 101, ejects the solution onto the substrate 101, and forms the wiring pattern 102.

In the embodiment, a method is described, in which the etching or ashing is carried out using linearly-arranged, cylindrical plasma-generation-means, and thus a semiconductor device is produced.

Figure 2:
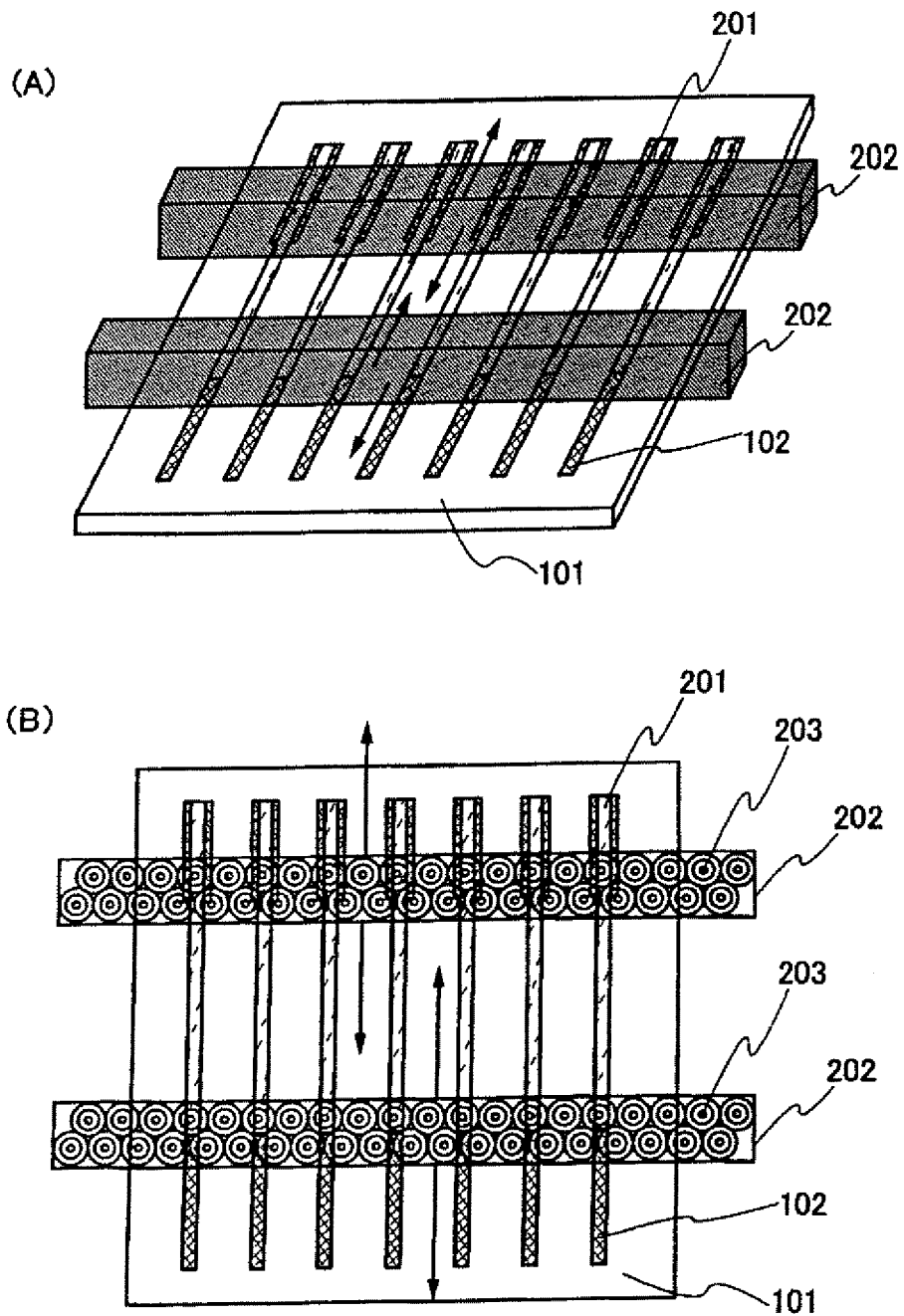
FIG. 2 is a view illustrating the production method of the invention.
Figure 3:
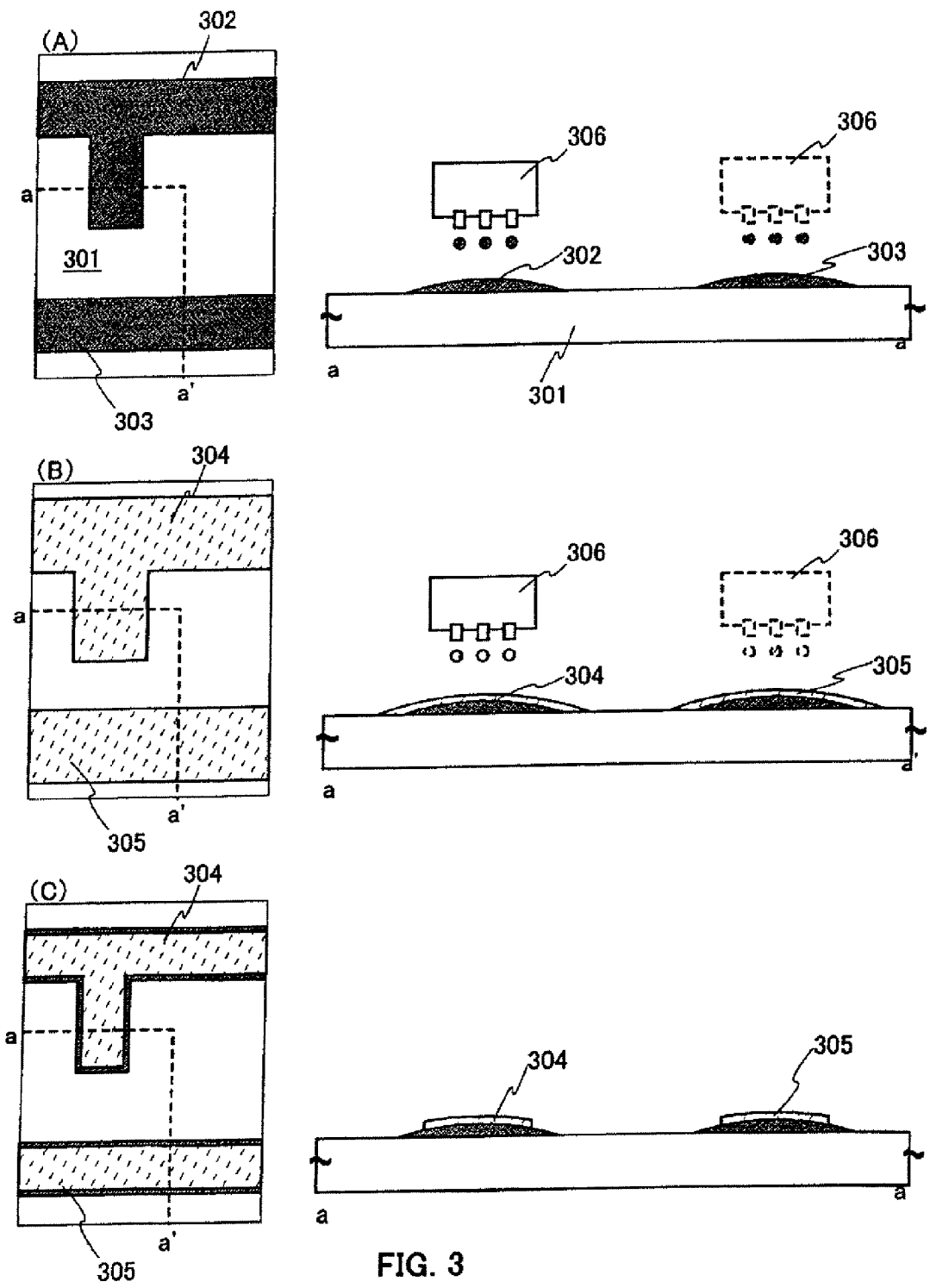
FIG. 3 is a view showing a method for producing a thin-film transistor of the invention.

FIG. 2 shows an etching method using the plasma generation means used in the embodiment. In FIG. 2, the plasma generation means 202 moves above the substrate 101, and etches a portion that is not covered by the resist 201 in the wiring pattern 102.

FIG. 2(B) is a top view of FIG. 2(A), in which a plurality of cylindrical plasma generation means 203 are arranged linearly with the bases 202 of the plasma generation means. The plasma generation means are linearly arranged, thereby the etching or ashing can be selectively carried out, and thus the amount of the gas used can be reduced, and reduction of the production cost is possible.

Various materials such as glass, quartz, semiconductor, plastic, metal, glass epoxy resin, and ceramics may be formed into a substrate 2301. Then, a known composite having conductivity is ejected on the substrate 2301 using solution ejection means 2306, and thereby gate electrode and wiring 2302, and capacitive electrode and wiring 2303 are formed (FIG. 17(A)).

Then, the substrate, on which the gate electrode and wiring 2302, and the capacitive electrode and wiring 2303 are formed, is subjected to heating treatment and the like, and thereby solvent in the composite is volatized in order to increase viscosity of the composite. The heating treatment can be performed for each formation of the thin film using the solution ejection method, or performed at each of optional processes, or performed collectively after all processes have been completed.

Next, resists 2304, 2305 are ejected using the solution ejection means 2306 such that the gate electrode and wiring 2302, and the capacitive electrode and wiring 2303 which have been ejected in the precedent process are covered (FIG. 17(B)).

Then, the resists are patterned (FIG. 17(C)).

Figure 18:
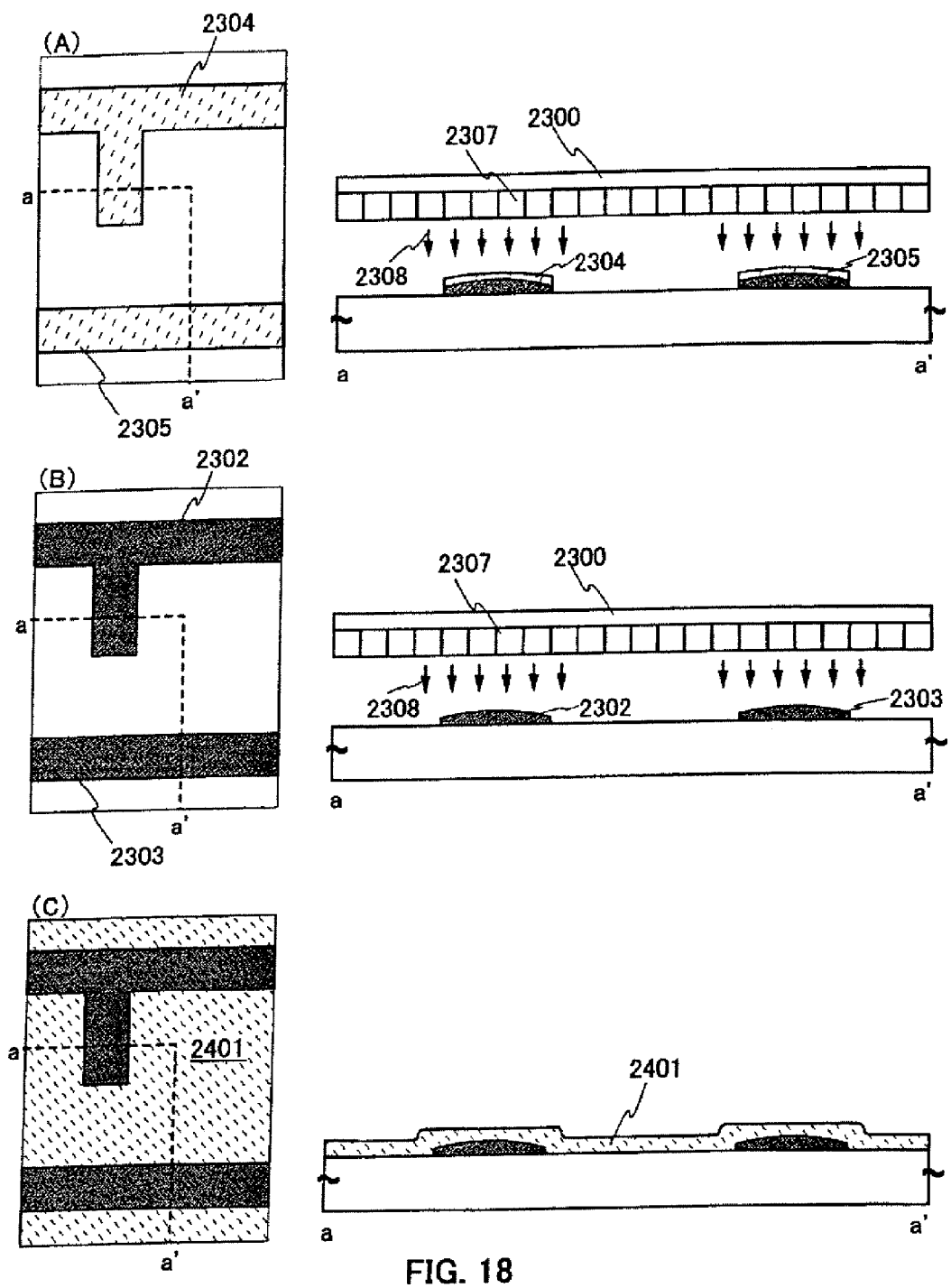
FIG. 18 is a view showing a method for producing the thin-film transistor of the invention.
Figure 19:
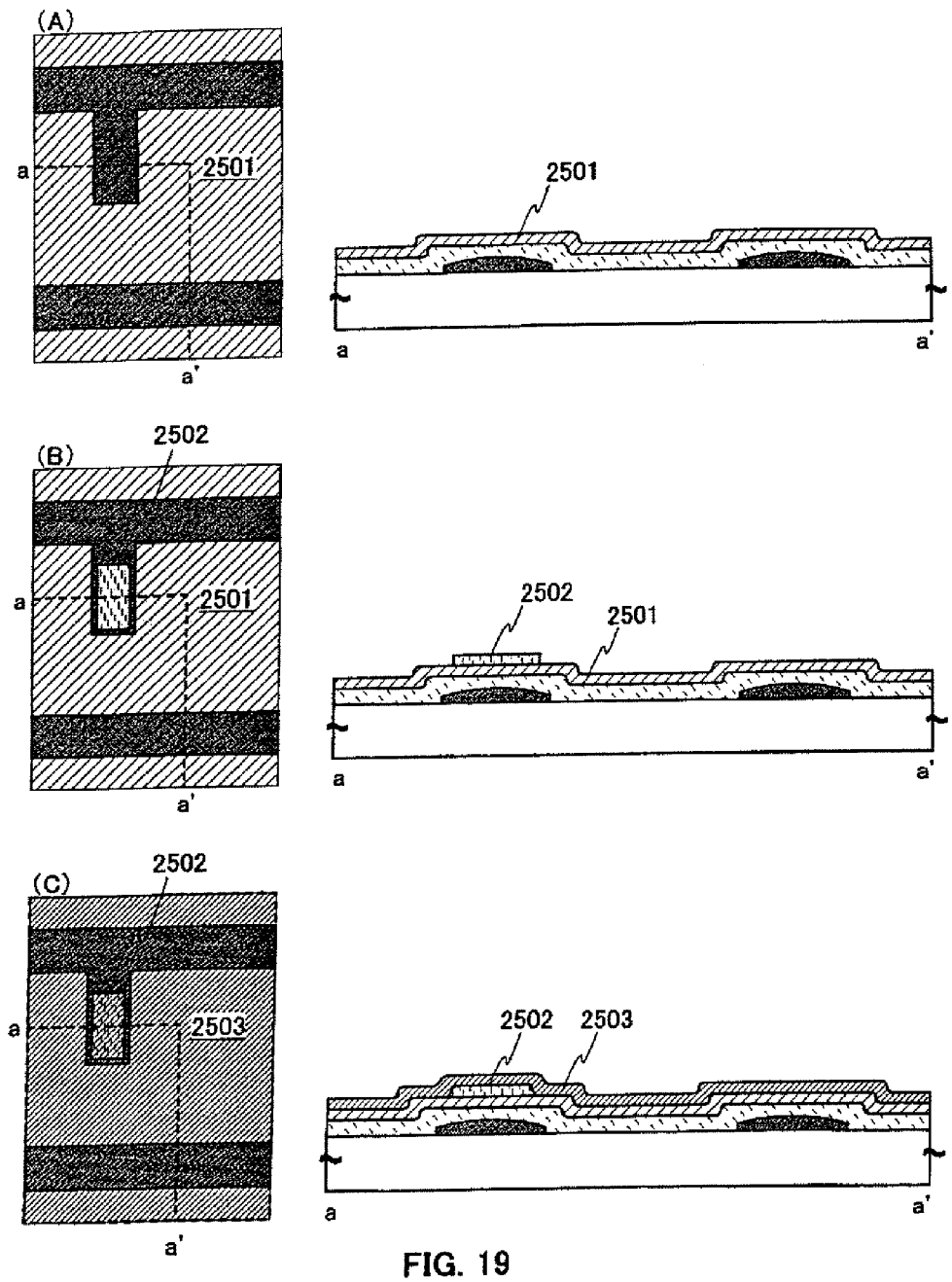
FIG. 19 is a view showing a method for producing the thin-film transistor of the invention.
Figure 20:
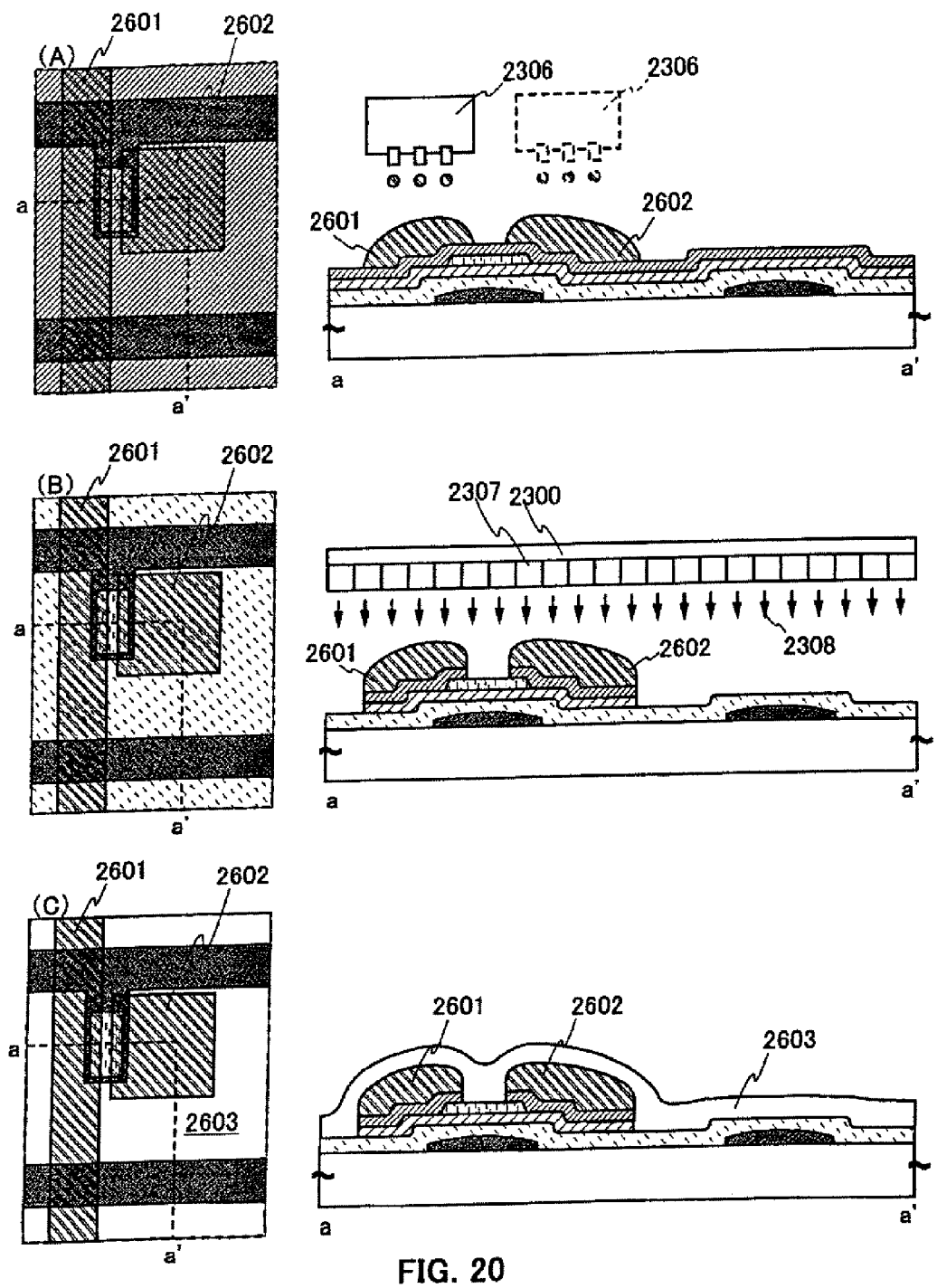
FIG. 20 is a view showing a method for producing the thin-film transistor of the invention.
Figure 21:
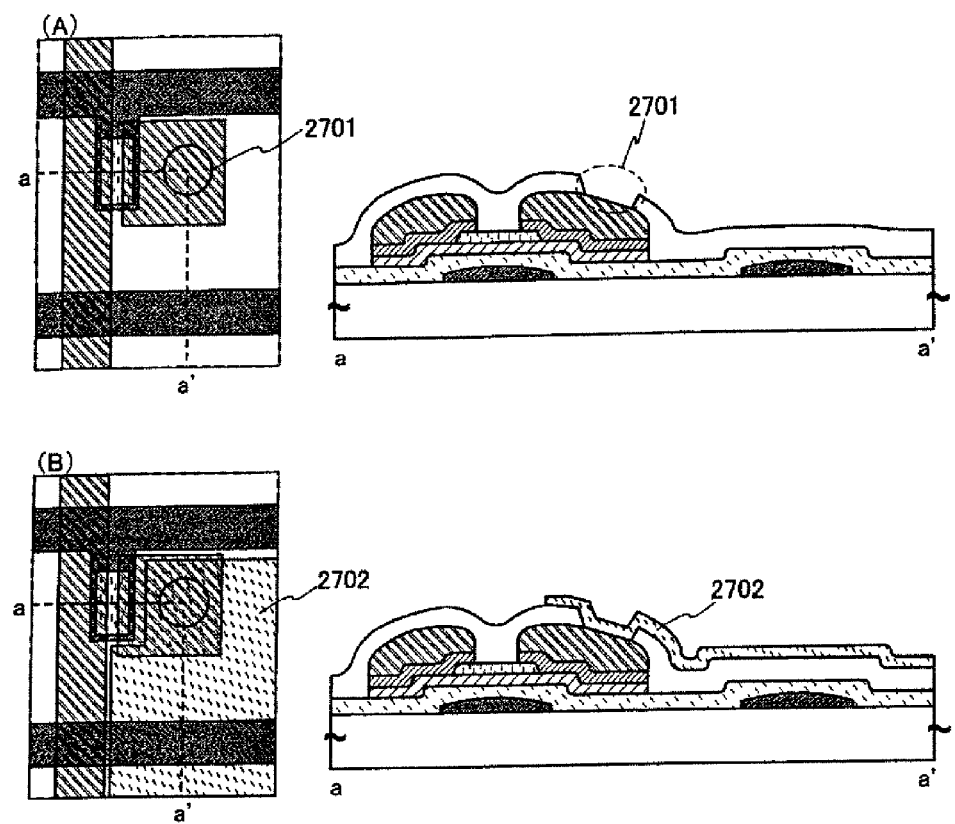
FIG. 21 is a view showing a method for producing the thin-film transistor of the invention.

Then, plasma 2308 is selectively generated using the atmospheric-pressure plasma device having a plurality of linearly-arranged, cylindrical plasma generation means 2307 and a base 2300, thereby the gate electrode and wiring 2302, and the capacitive electrode and wiring 2303 are etched, and then the resists are removed by the ashing (FIG. 18(A, B)).

According to the above processes, the gate electrode and wiring 2302, and the capacitive electrode and wiring 2303 are formed. As a material for forming the gate electrode and wiring 2302, and the capacitive electrode and wiring 2303, a conductive material such as Mo, Ti, Ta, W, Cr, Al, Cu, and Al containing Nd and the like is given, or a plurality of conductive materials can be used in the stacked manner.

Then, a gate insulating film 2401 is formed using a known method such as CVD method (FIG. 18(C)). Although the silicon nitride film is formed as the gate insulating film 2401 using the CVD method at the atmospheric pressure in the embodiment, the silicon oxide film, or the stacked structure of them can be also used.

Then, a semiconductor film 2501 is deposited 25 to 80 nm (preferably 30 to 60 nm) in thickness using a known method (sputtering method, LPCVD method, plasma CVD method, and the like). As the semiconductor film 2501, the amorphous semiconductor film, the compound semiconductor film having the amorphous structure such as the amorphous silicon germanium film, and the like are used and formed on an entire surface of the substrate 2301 (FIG. 19(A)).

Then, the silicon nitride film and the like are deposited on the entire surface and patterned, and thereby a channel protection film 2502 is formed (FIG. 19(B)).

Then, a semiconductor film 2503 doped with the impurity element imparting the n-type is formed (FIG. 19(C)).

Then, source/drain electrodes and wiring 2601, 2602 are formed using the solution ejection means (FIG. 20(A)). The source/drain electrodes and wiring 2601, 2602 can be patterned similarly to the gate electrode and wiring 2302, and the capacitive electrode and wiring 2303 shown in FIG. 17(A) to FIG. 18(B).

As a material for forming the source/drain electrodes and wiring 2601, 2602, a conductive material such as Mo, Ti, Ta, W, Cr, Al, Cu, and Al containing Nd and the like is given, or a plurality of conductive materials can be used in the stacked manner.

Then, using the source/drain electrodes and wiring 2601, 2602 as a mask, the plasma 2308 is selectively generated using the atmospheric-pressure plasma device having a plurality of linearly-arranged, cylindrical plasma-generation-means 2307 and a base 2300, and thereby the semiconductor film 2503 doped with the impurity element imparting the n-type and the semiconductor film 2501 are etched.

Then, the protection film 2603 is formed using a known method such as CVD method (FIG. 20(C)). Although the silicon nitride film is formed as the protection film 2603 using the CVD method at the atmospheric pressure in the embodiment, the silicon oxide film, or the stacked structure of them can be also used. An organic resin film such as acrylic film can be also used.

Then, a resist is ejected using the solution ejection means 2306, and then the resist is patterned. Then, the plasma 2308 is generated using the atmospheric-pressure plasma device having the plurality of linearly-arranged plasma-generation-means 2307 and the base 2300, and then the protection film 2603 is etched and a contact hole 2701 is formed (FIG. 21(A)).

Then, a pixel electrode 2702 is foimed using the solution ejection method. The pixel electrode 2702 may be directly formed using the solution ejection means 2306, or patterned similarly to the gate electrode and wiring 2302, and the capacitive electrode and wiring 2303 shown in FIG. 17(A) to FIG. 18(B). As a material for forming the pixel electrode 2702, the transparent conductive film such as ITO (indium oxide/tin oxide alloy), indium oxide/zinc oxide alloy ($In_2O_3$—ZnO), and zinc oxide (ZnO), or the conductive material such as Mo, Ti, Ta, W, Cr, Al, Cu, and Al containing Nd and the like is given, or a plurality of conductive materials can be used in the stacked manner.

The semiconductor device produced according to the embodiment is what is called the channel protection type where the channel formation region is protected by the protection film.

Although it is shown as an example in the embodiment that the patterns of the wiring and the resist and the like are formed using the solution ejection method, and the etching and the ashing are carried out using the atmospheric pressure plasma having the linearly-arranged plasma-generation-means, these can be also carried out in combination with the various known methods for producing the TFT.

By selectively forming the patterns of the wiring and the resist and the like using the solution ejection means, the amount of the material used in production of the semiconductor device, most of which has been conventionally wasted, is reduced, and thereby the production cost of the display device using the semiconductor device can be reduced.

Furthermore, by forming the wiring and the like using the material having the fluidity, the coverage over the contact hole and the step is improved, and the defects such as the bad contact and the breaking wire can be reduced.

Moreover, the etching or the ashing is selectively carried out using the linearly-arranged plasma-generation-means, thereby the amount of the gas used can be also reduced, and the production cost can be reduced.

(Third Embodiment)

Figure 22:
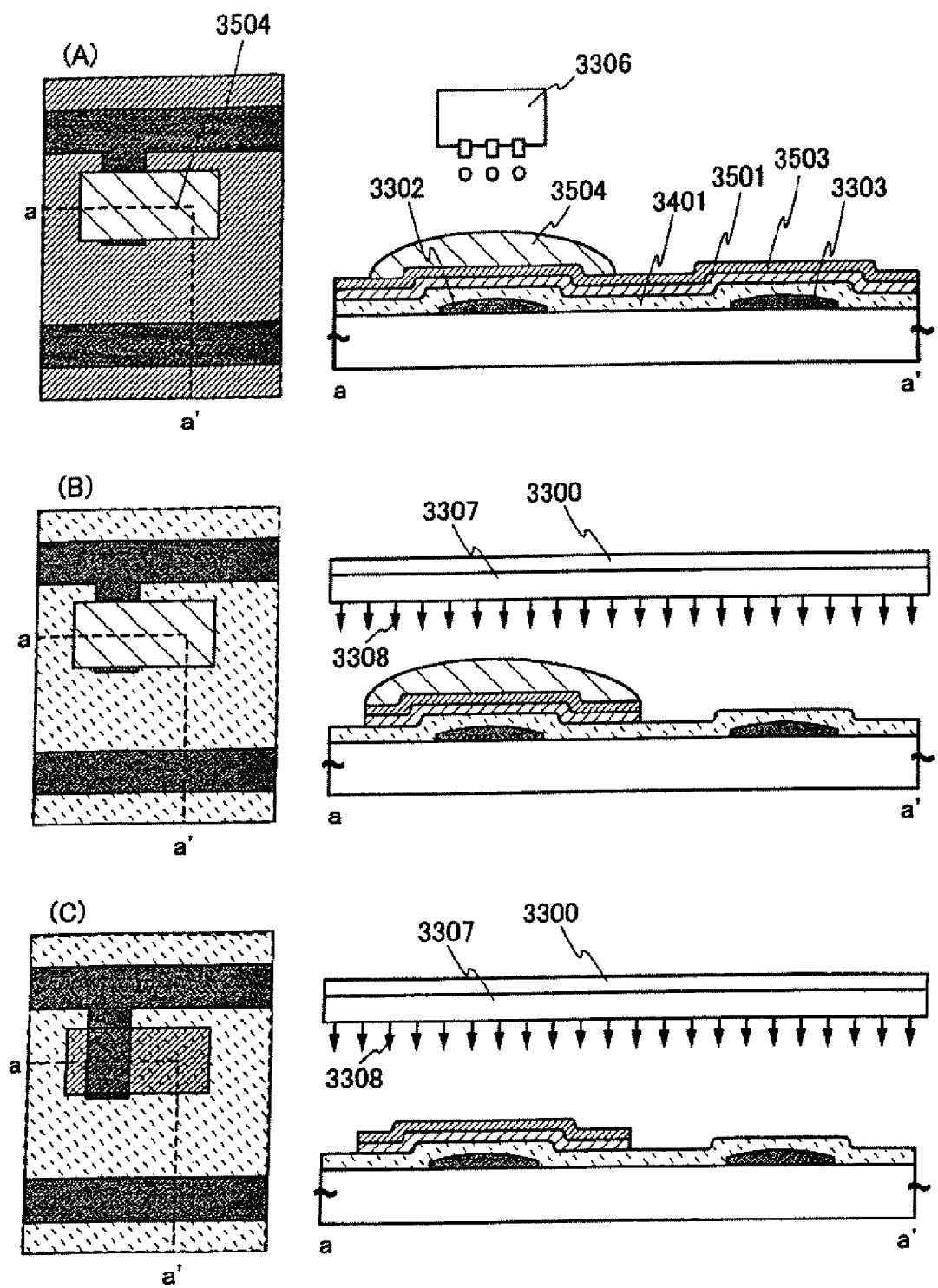
FIG. 22 is a view showing a method for producing the thin-film transistor of the invention.
Figure 23:
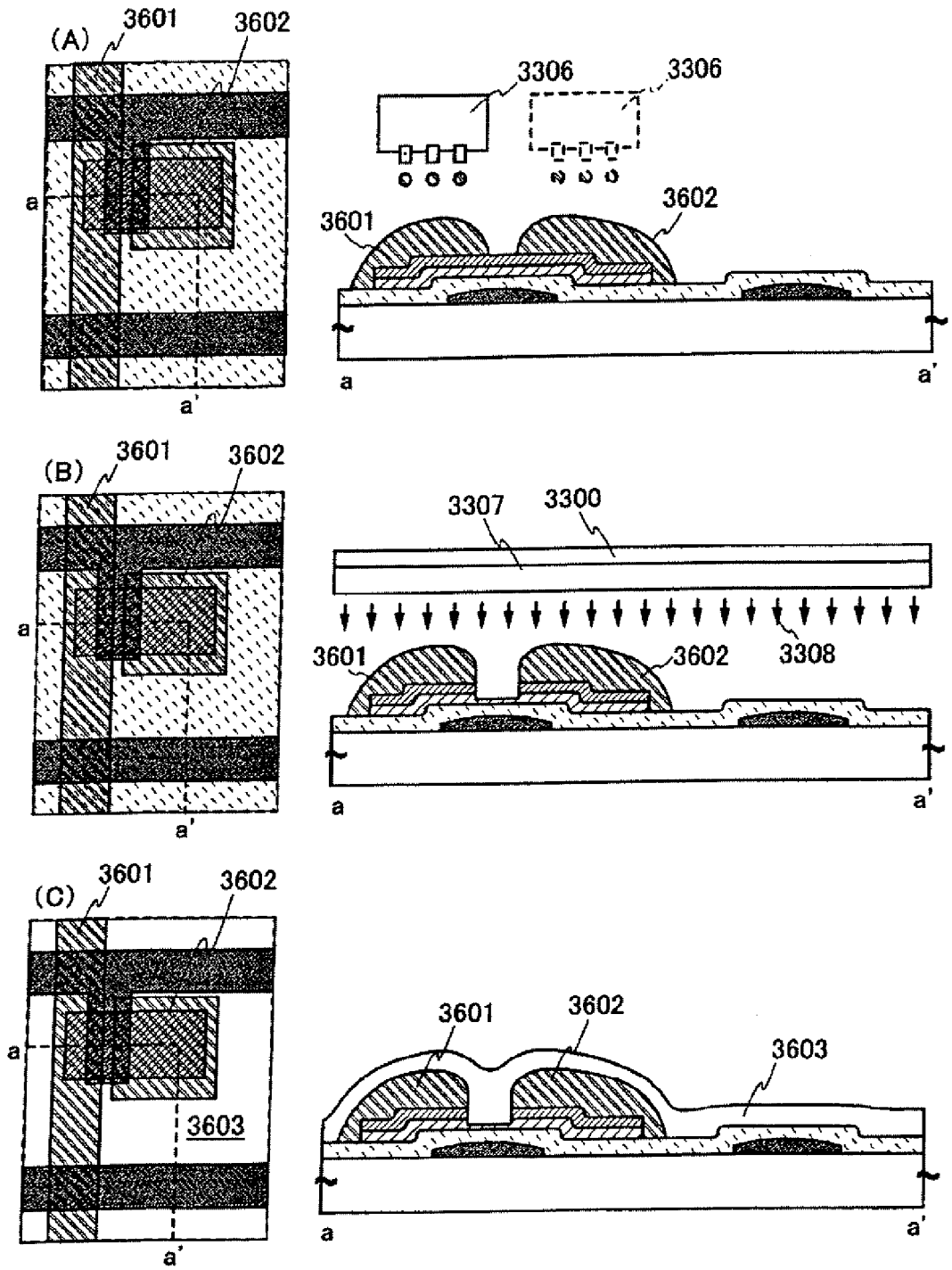
FIG. 23 is a view showing a method for producing the thin-film transistor of the invention.
Figure 24:
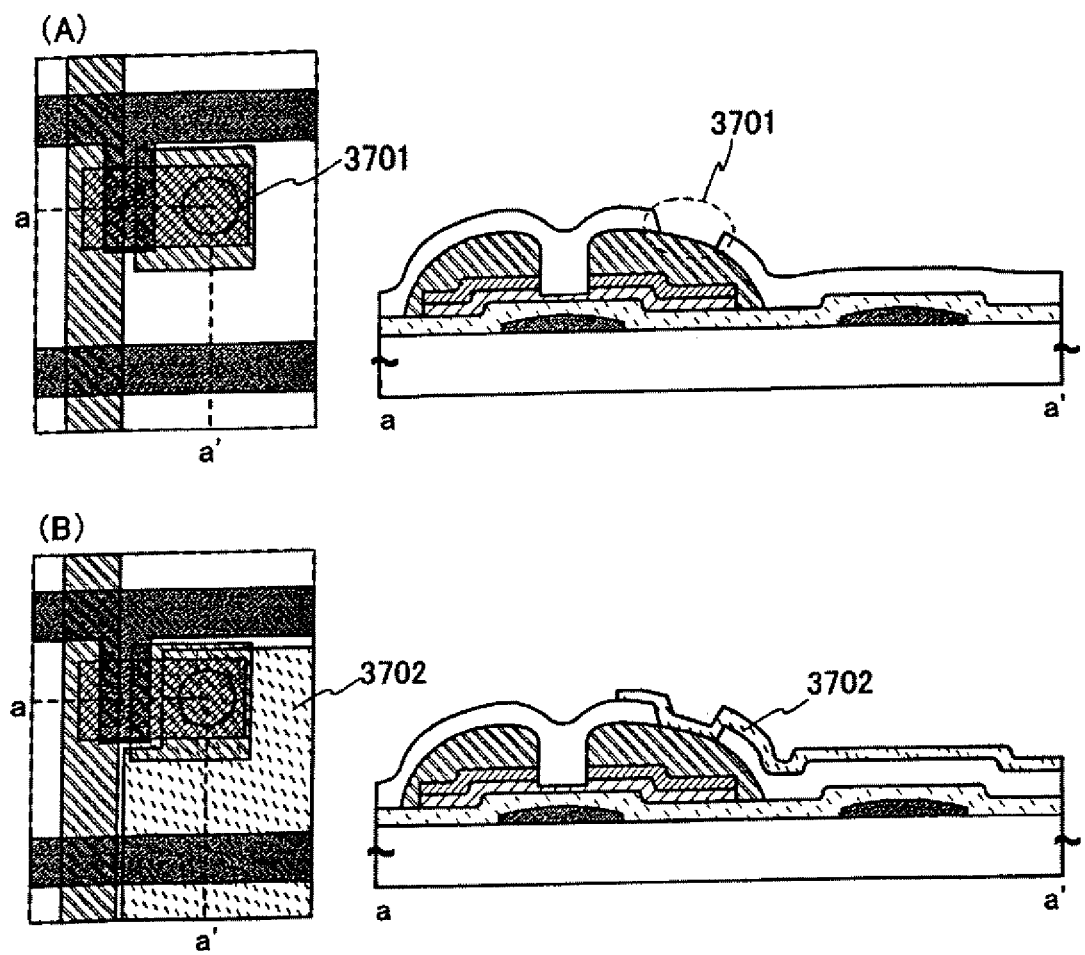
FIG. 24 is a view showing a method for producing the thin-film transistor of the invention.

In the embodiment, a method for producing what is called the channel-etching-type semiconductor device, having a channel formation region that is not covered by the protection film, is described using FIG. 22 to FIG. 24.

As the first embodiment or the second embodiment, gate electrode and wiring 3302, and capacitive electrode and wiring 3303 are formed on a substrate, and a gate insulating film 3401, a semiconductor film 3501, and a semiconductor film 3503 doped with the impurity element imparting the n-type are formed.

Next, a solution containing a resist 3504 is ejected using solution ejection means 3306 (FIG. 22(A)).

Then, linear plasma 3308 is generated using an atmospheric-pressure plasma device having linear plasma generation means 3307 and a base 3300, and thereby the semiconductor film 3503 doped with the impurity element imparting the n-type and the semiconductor film 3501 are etched. (FIG. 22(B)).

Then the resist is removed by the ashing (FIG. 22(C)).

Then, source/drain electrodes and wiring 3601, 3602 are formed using the solution ejection means 3306 such that the semiconductor film 3503 doped with the impurity element imparting the n-type and the semiconductor film 3501 are covered (FIG. 23(A)). The source/drain electrodes and wiring 3601, 3602 can be patterned similarly to the gate electrode and wiring 3302, and the capacitive electrode and wiring 3303 shown in FIG. 3(A) to FIG. 4(B). As a material for forming the source/drain electrodes and wiring 3601, 3602, the conductive material such as Mo, Ti, Ta, W, Cr, Al, Cu, and Al containing Nd and the like is given, or a plurality of the conductive materials can be used in the stacked manner.

Then, a protection film 3603 is formed using a known method such as CVD method (FIG. 23(C)). Although a silicon nitride film is formed as the protection film 3603 using the CVD method at the atmospheric pressure in the embodiment, the silicon oxide film or the stacked structure of them can be also used. The organic resin film such as the acrylic film can be also used.

Then, a resist is ejected using the solution ejection means 3306, and then patterned. Then, the linear plasma 3308 is generated using the atmospheric-pressure plasma device having the linear plasma generation means 3307 and the base 3300, then the protection film 3603 is etched, and a contact hole 3701 is formed (FIG. 24(A)).

Then, a pixel electrode 3702 is formed similarly to the first embodiment or the second embodiment.

The semiconductor device produced according to the embodiment is what is called the channel etching type where the channel formation region is not protected by the protection film.

Although the linear plasma generation means was used in the embodiment, a plurality of linearly-arranged, cylindrical plasma-generation-means shown in the second embodiment can be also used.

(Fourth Embodiment)

In the embodiment of the invention, a material having the fluidity is used when the wiring and the like are formed, thereby the coverage over the contact hole or the step is improved, and stepping cut in the wiring pattern and the like, or bad contact and the like can be reduced.

Particle size of the wiring material used herein needs to be smaller than that of the contact hole, and it is desirable that preferably one of particles several micrometers to sub-micrometers in size and nanometer-sized particles is used, and more preferably particles having several sizes are combined to be used.

(Fifth Embodiment)

In the embodiment of the invention, when a semiconductor device is produced using a translucent substrate, a large area substrate having a substrate size including 600 mm×720 mm, 680 mm×880 mm, 1000 mm×1200 mm, 1100 mm×1250 mm, 1150 mm×1300 mm, 1500 mm×1800 mm, 1800 mm×2000 mm, 2000 mm×2100 mm, 2200 mm×2600 mm, or 2600 mm×3100 mm is used.

By using such a large substrate, the production cost can be reduced. As a usable substrate, a substrate of glass such as barium-borosilicate glass represented by #7059 glass or #1737 glass from Corning Corp., and alumino-borosilicate glass can be used. Further, as another substrate, various translucent substrates including quartz, semiconductor, plastic, metal, glass epoxy resin, ceramics can be also used.

(Sixth Embodiment)

Although the method for producing the channel-protection-type amorphous silicon TFT is shown in the first embodiment to the second embodiment, it is obvious that the channel-etching-type amorphous silicon TFT can be produced using the similar method.

Moreover, the method for forming the wiring and the like shown in the first embodiment to the third embodiment can be also applied to low-temperature polysilicon TFT and the like.

(Seventh Embodiment)

The semiconductor device produced in the embodiments of the invention can be used for a liquid display device, a light-emitting display device represented by an EL display, and the like.

(Eighth Embodiment)

Figure 8:
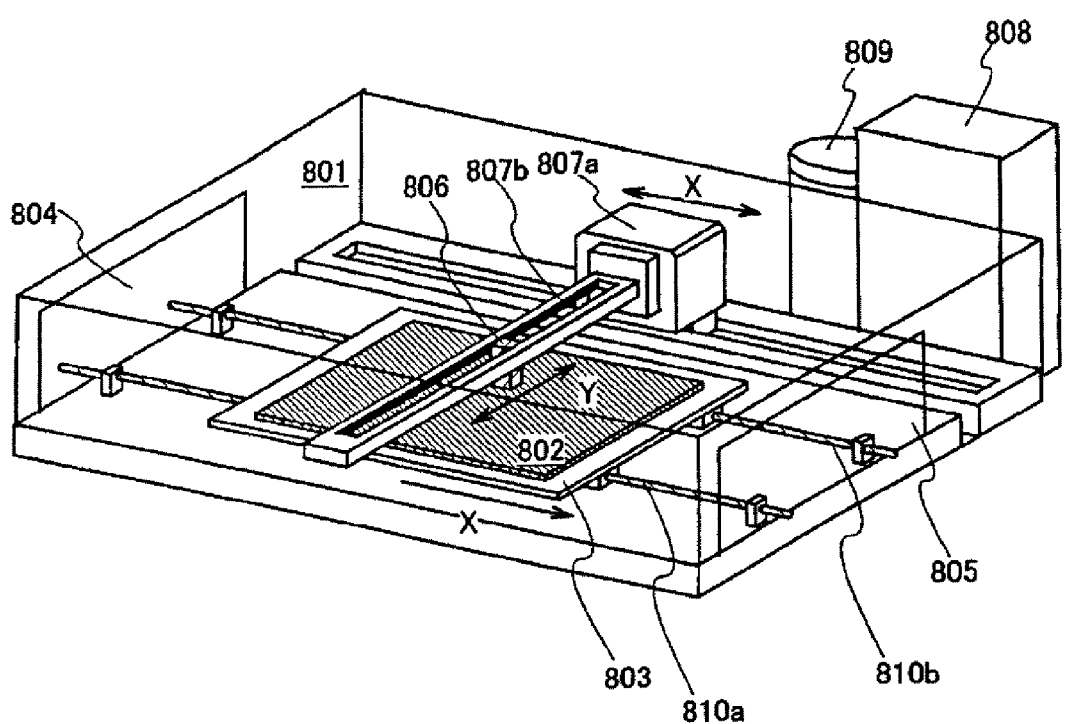
FIG. 8 is a view showing an example of a solution ejection device used in implementing the invention.
Figure 9:
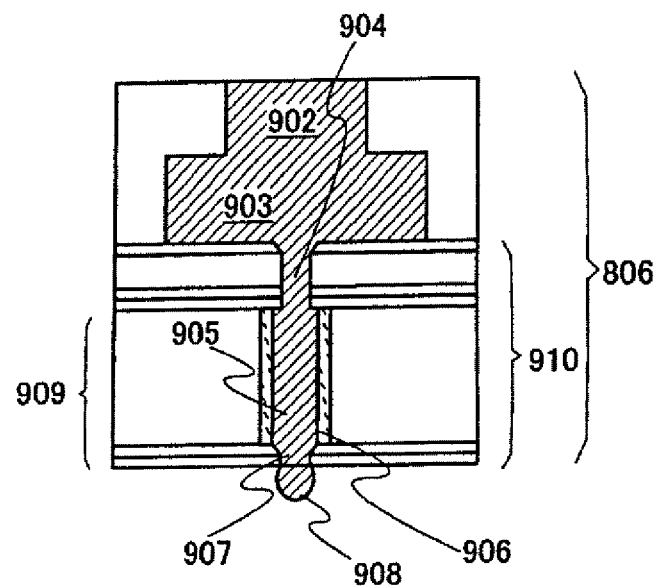
FIG. 9 is a view showing an example of the solution ejection device used in implementing the invention.
Figure 10:
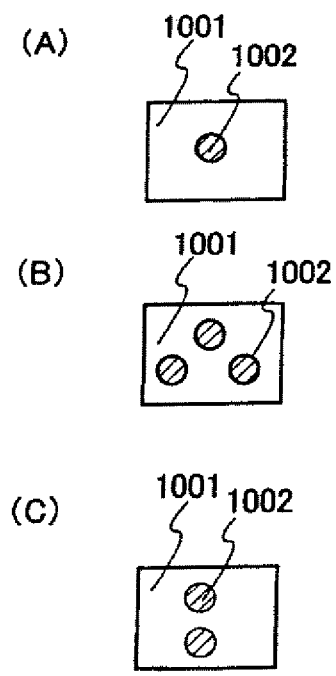
FIG. 10 is a view showing an example of the solution ejection device used in the invention.

An example of a solution ejection device, having one or more of solution ejection means that are arranged in a cluster pattern, used for implementing the embodiments is described using FIG. 8 to FIG. 10.

FIG. 8 shows an example of a configuration of a dot-pattern solution ejection device, and FIG. 9 and FIG. 10 show solution ejection means in which a nozzle used in the dot-pattern solution ejection device is disposed.

The dot-pattern solution ejection device shown in FIG. 8 has solution ejection means 806 in the device, and is intended to obtain a desired pattern in a substrate 802 by ejecting the solution using the means. The dot-pattern solution ejection means can be applied to a resin substrate represented by a plastic substrate in addition to the glass substrate having a desired size as the substrate 802, or a material to be processed such as a semiconductor wafer represented by silicon.

In FIG. 8, the substrate 802 is carried into the inside of a chassis 801 from a carry-in port 804, and the substrate after being subjected to the solution ejection process is carried out from a carry-out port 805. Within the chassis 801, the substrate 802 is mounted on a conveyance table 803, and the conveyance table 803 moves on rails 810a, 810b connecting between the carry-in and carry-out ports.

Bases 807a and 807b of the solution ejection means are a mechanism for supporting the solution ejection means 806, and moving the solution ejection means 806 to any point in an X-Y plane. The base 807a of the solution ejection means moves in an X direction parallel to the conveyance table 803, and the solution spraying means 806 attached to the base 807b of the solution ejection means fixed to the base 807a of the solution ejection means moves in a Y direction perpendicular to the X direction. At the same time when the substrate 802 is carried into the inside of the chassis 801, the base 807a of the solution ejection means and the solution ejection means 806 move in the X and Y directions respectively, and are set to initial, predetermined positions where the solution ejection process is performed. The movement of the base 807a of the solution ejection means and the solution ejection means 806 to the initial positions is performed during the carry-in or carry-out of the substrate, and thereby the solution ejection process can be efficiently performed.

The solution ejection process starts when the substrate 802 arrives at a predetermined position, at which the solution ejection means 806n is waiting, with the movement of the conveyance table 803. The solution ejection process is achieved by a combination of relative movement among the base 807a of the solution ejection means, solution ejection means 806, and the substrate 802, and solution ejection from the solution ejection means 806 supported by the base of the solution ejection means. By controlling the moving speed of the base of the substrate or the solution ejection means, and the solution ejection means, and a cycle of ejection of the solution from the solution ejection means 806, a desired pattern can be drawn on the substrate 802. Particularly, since the solution ejection process is required to have high accuracy, it is desired that the movement of the conveyance table is stopped during the solution ejection, and only the base 807 of the solution ejection means and the solution ejection means, which are highly controllable, are scanned. Moreover, each scan of the solution ejection means 806 and the base 807a of the solution ejection means in the X-Y direction is not limited to one way, and the solution ejection process may be performed by moving them back and forth or repeatedly moving them back and forth.

The solution is supplied from a solution supply 809 provided outside the chassis 801 into the inside of the chassis, and in turn supplied into a liquid room inside the solution ejection means 806 through the bases 807a, 807b of the solution ejection means. The liquid supply is controlled by control means 808 provided outside the chassis 801, however, it may be controlled by control means incorporated in the base 807a of the solution ejection means within the chassis.

Also, the movement of the conveyance table and the base of the solution ejection means is controlled by the control means 808 provided outside the chassis 801.

While not shown in FIG. 8, a sensor for alignment with the substrate or a pattern on the substrate, means for introducing gas into the chassis, means for exhausting the inside of the chassis, means for heating the substrate, means for irradiating light on the substrate, and means for measuring various physical property values such as temperature and pressure can be additionally provided as required. These means can be also controlled collectively by the control means 808 provided outside the chassis 801. Furthermore, if the control means 808 is connected to a production control system and the like through a LAN cable, a wireless LAN, an optical fiber, and the like, the process can be controlled integrally from the outside, leading to improvement in productivity.

Next, an internal structure of the solution ejection means 806 is described. FIG. 9 shows a section of the solution ejection means 806 of FIG. 8, which is viewed parallel to the Y direction.

The solution supplied from the outside into the inside of the solution ejection means 806 passes through a liquid room channel 902 and is stored in a preparation liquid room 903, and then moves to a nozzle 909 for ejecting the solution. A nozzle part 910 comprises a fluid resistance part 904 provided for loading an appropriate amount of solution into the nozzle, a pressure room 905 for pressurizing the solution for ejecting the solution outside the nozzle, and a solution ejection port 907.

A piezoelectric element 906 using a material having the piezoelectric effect of transforming when applied voltage such as lead titanate zirconate ($Pb(Zr, Ti)O_3$) is disposed on a sidewall of the pressure room 905. Therefore, by applying voltage to the piezoelectric element 906 disposed in an intended nozzle, solution in the pressure room 905 is pushed out and thus the solution 908 can be ejected outside.

The nozzle diameter is set to 0.1 to 50 µm (preferably 0.6 to 26 µm), and an amount of the composite ejected from the nozzle is set to 0.00001 pl to 50 pl (preferably 0.0001 to 40 pl). The ejection amount increases in proportion to size of the nozzle diameter. A distance between the material to be processed and the nozzle ejection port is preferably made as close as possible, and preferably set to about 0.1 to 2 mm in order to drop the composite to desired points. Even if the nozzle diameter is not changed, the ejection amount can be also controlled by changing pulse voltage applied to the piezoelectric element. These ejection conditions are desirably set such that a line width is about 10 µm or less.

Viscosity of the composite used in the solution ejection method is preferably 300 mPa·s or lower, so that the composite is prevented to be dried, and smoothly ejected from the ejection port. Surface tension of the composite is preferably 40 mN/m or lower. However, the viscosity and the like of the composite can be appropriately adjusted depending on the solvent used or applications. For example, viscosity of a composite in which ITO, ITSO, organoindium, or organotin is dissolved or dispersed in a solvent is 5 to 50 mPa·s, viscosity of a composite in which silver is dissolved or dispersed in the solvent is 5 to 20 mPa·s, and viscosity of a composite in which gold is dissolved or dispersed in the solvent is 10 to 20 mPa·s.

Although the solution ejection is performed by means of what is called the piezoelectric method using the piezoelectric element in the invention, in some solution material, what is called the thermal inkjet method can be used, in which a heater element is heated and an air bubble is generated to eject the solution. In this case, the piezoelectric element 906 is replaced with the heater element in a structure.

In the nozzle 910 for ejecting the solution, wettability of the solution to the liquid room channel 902, preparation liquid room 903, fluid resistance part 904, pressure room 905, and solution ejection port 907 is important. Therefore, a carbon film, a resin film, and the like can be formed on respective channels for adjusting the wettability to materials.

According to the above means, the solution can be ejected on the substrate to be processed. In the solution ejection method, there are what is called the sequential method where the solution is sequentially ejected and a linear pattern is formed sequentially, and what is called the on-demand method where the solution is ejected in the dot pattern, and the on-demand method is shown in the device configuration in the invention, however, the solution ejection means using the sequential method (not shown) can be also used.

FIG. 10(A) to FIG. 10(C) schematically show a bottom of the solution ejection means in FIG. 9. FIG. 10(A) shows a basic arrangement where one solution ejection port 1002 is provided in a bottom 1001 of the solution ejection means. On the other hand, FIG. 10(B) shows what is called the cluster-pattern arrangement where the solution ejection ports 1002 in the bottom 1001 of the solution ejection means are increased to three such that they form a triangle. FIG. 10(C) shows an arrangement where the solution ejection ports are vertically aligned. In this arrangement, after ejecting the solution from an upper solution ejection port 1002, a similar solution is ejected on the same point from a lower solution ejection port 1002 with time difference, thereby the same solution can be additionally deposited before the previously ejected solution is dried or solidified on the substrate. Moreover, when the upper solution ejection port is clogged due to the solution and the like, the lower solution ejection port can be acted as a spare.

By selectively forming the film using the solution ejection means, the amount of the film (resist film, metal film, semiconductor film, organic film, and the like) used, most of which has been conventionally wasted, is reduced, thereby the production cost can be reduced.

(Ninth Embodiment)

Figure 11:
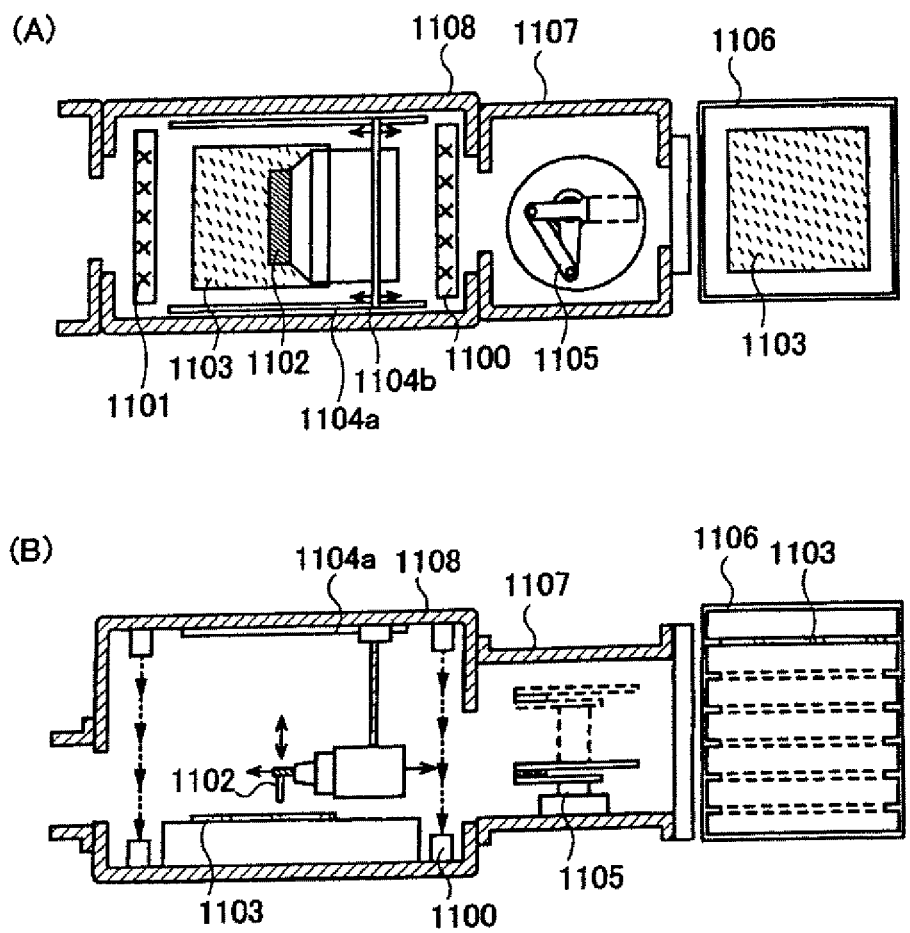
FIG. 11 is a view showing an example of an atmospheric-pressure plasma device used in implementing the invention.
Figure 12:
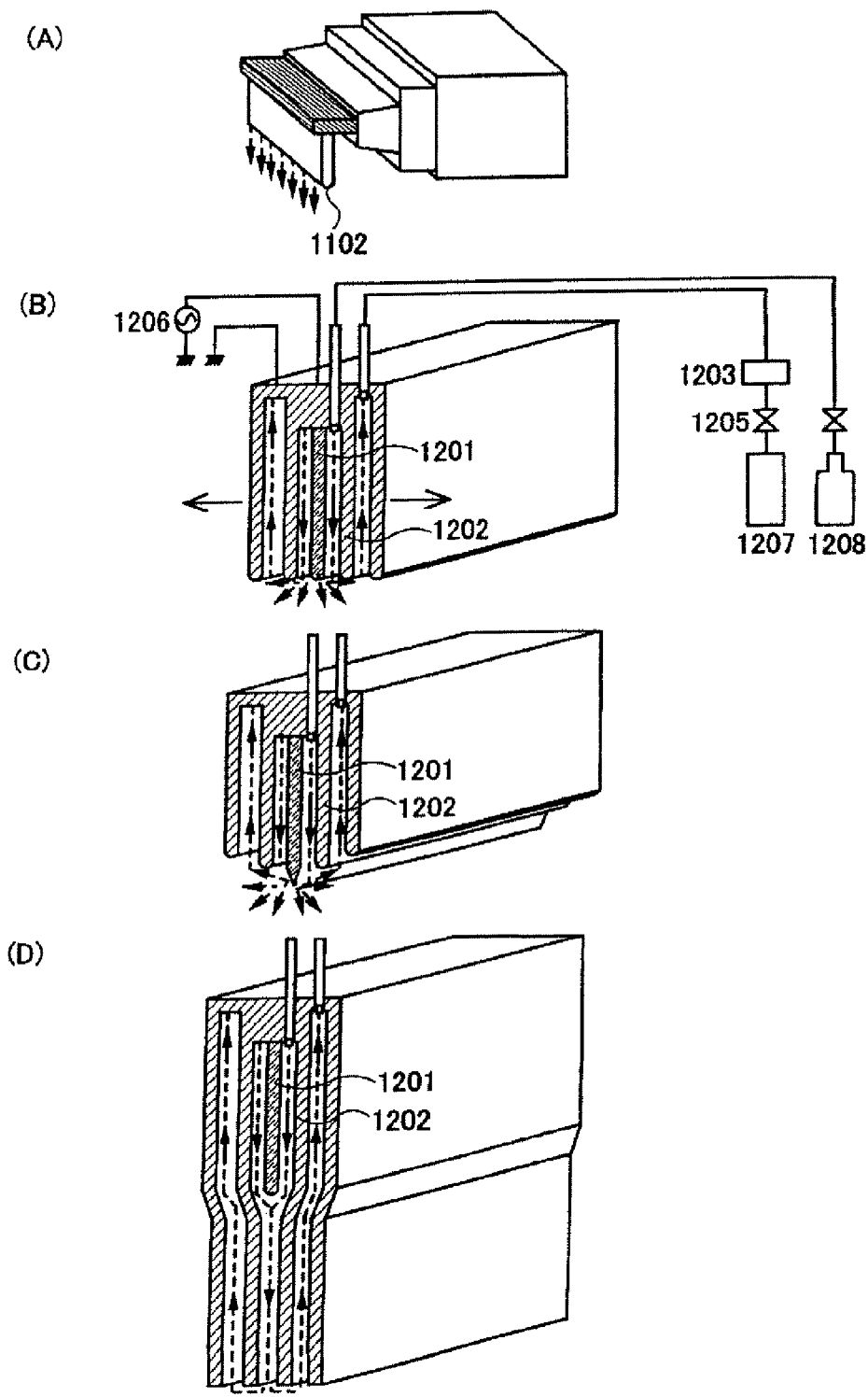
FIG. 12 is a view showing an example of the atmospheric-pressure plasma device used in the invention.

An example of a linearly-processible atmospheric-pressure plasma device used for implementing the embodiments is described using FIG. 11 to FIG. 12.

FIG. 11(A) and FIG. 11(B) are a top view and a section view of the device. In the figures, a material to be processed 1103 such as a glass substrate in desired size and a resin substrate represented by a plastic substrate are set in a cassette room 1106. As a conveyance method of the material to be processed 1103, a horizontal conveyance is given, however, a vertical conveyance may be performed aiming to reduce the area occupied by a conveyance machine.

In a conveyance room 1107, the material to be processed 1103 disposed in the cassette room 1106 is conveyed to a plasma treatment room 1108 using a conveyance mechanism (robot arm and the like) 1105. In the plasma treatment room 1108 adjacent to the conveyance room 1107. air-stream control means 1100, rails 1104a, 1104b for moving plasma generation means 1102 that generates the linear plasma, moving means that moves the material to be processed 1103, and the like are provided. Also, known heating means (not shown) such as lump is provided as required.

The air-stream control means 1100, which is for the purpose of dust-proof, controls the air-stream using inert gas ejected form a nozzle 1101 such that the rooms are shielded from the atmosphere. The plasma generation means 1102 moves to a predetermined position along the rail 1104a disposed in a conveyance direction of the material to be processed 1103, and along the rail 1104b disposed in a direction perpendicular to the conveyance direction.

Next, an example of the plasma generation means 1102 is described using FIG. 12. FIG. 12(A) is a perspective view of the plasma generation means 1102 generating the linear plasma, and FIG. 12(B) to FIG. 12(D) are section views of electrodes.

In FIG. 12(B), dot lines show gas channels, and 1201, 1202 are electrodes comprising a metal having the conductivity such as aluminum and copper, and a first electrode 1201 is connected to a power source (high-frequency power source) 1206. The first electrode 1201 may be connected with a cooling system (not shown) for circulating cooling water. If the cooling system is provided, circulation of the cooling water prevents heating in case of continuous surface treatment owing to circulation of cooling water, and improvement in efficiency can be achieved due to the continuous process. A second electrode 1202 has a profile surrounding periphery of the first electrode 1201, and is electrically grounded. The first electrode 1201 and the second electrode 1202 have a cylindrical pattern having a nozzle-like pore for gas on their ends. A process gas is supplied from gas supply means (gas bomb) 1208 through a valve 1205 into a space between both electrodes of the first electrode 1201 and the second electrode 1202. Thus, the atmosphere in the space is replaced, and when high-frequency voltage (10 to 500 MHz) is applied to the first electrode 1201 from the high-frequency power source 1206 in this condition, plasma is generated in the space. Then, when reactive gas flow containing chemically active excited-species such as ions and radicals generated by the plasma is irradiated to a surface of the material to be processed, predetermined surface treatment can be carried out on the surface of the material to be processed.

A type of the process gas filled in the gas supply means (gas bomb) 1208 is appropriately determined depending on a type of the surface treatment performed in the processing room. Exhaust gas is introduced into an exhaust system 1207 through a filter 1203 for removing dust mixed into the gas and a valve 1205.

At least one of the first electrode and the second electrode needs to be covered by a solid dielectric (not shown). If a site exists, which is not covered by the solid dielectric and in which the electrodes are directly opposed to each other, arc discharge occurs at the site. As the solid dielectric; a metal oxide such as silicon dioxide, aluminum oxide, zirconium dioxide, and titanium dioxide; plastic such as polyethylene terephthalate and polytetrafluoroethylene; glass; a composite oxide such as barium titanate, and the like are given. While a shape of the solid dielectric may be either sheet-like or film-like, its thickness is preferably 0.05 to 4 mm. High voltage is required for generating discharge plasma, and if the thickness is excessively small, dielectric breakdown occurs when voltage is applied, causing the arc discharge.

Next, linear plasma generation means 1102 having a different section from that in FIG. 12(B) is shown in FIG. 12(C) and FIG. 12(D). In FIG. 12(C), the first electrode 1201 is longer than the second electrode 1202, and the first electrode 1201 has an acute angle pattern, while plasma generation means 1102 shown in FIG. 12(D) has a pattern for ejecting the plasma generated between the first electrode 1201 and the second electrode 1202 to the outside.

By linearly arranging the gas nozzles, the etching or the ashing is locally carried out, thereby the amount of the gas used can be also reduced, and thus the production cost can be reduced.

Moreover, the etching or the ashing is processed at the atmospheric pressure or the near-atmospheric pressure, thereby the vacuum chamber and pump, and the like forming the device can be simplified and increase in size of the device can be prevented. In addition, cost of device maintenance is reduced; and during the process, treatment, which has been conventionally performed after the chamber was evacuated into a vacuum state, can be performed at the atmospheric pressure or the near-atmospheric pressure without needing the vacuum evacuation. Therefore process time of the substrate can be reduced.

(Tenth Embodiment)

Figure 15:
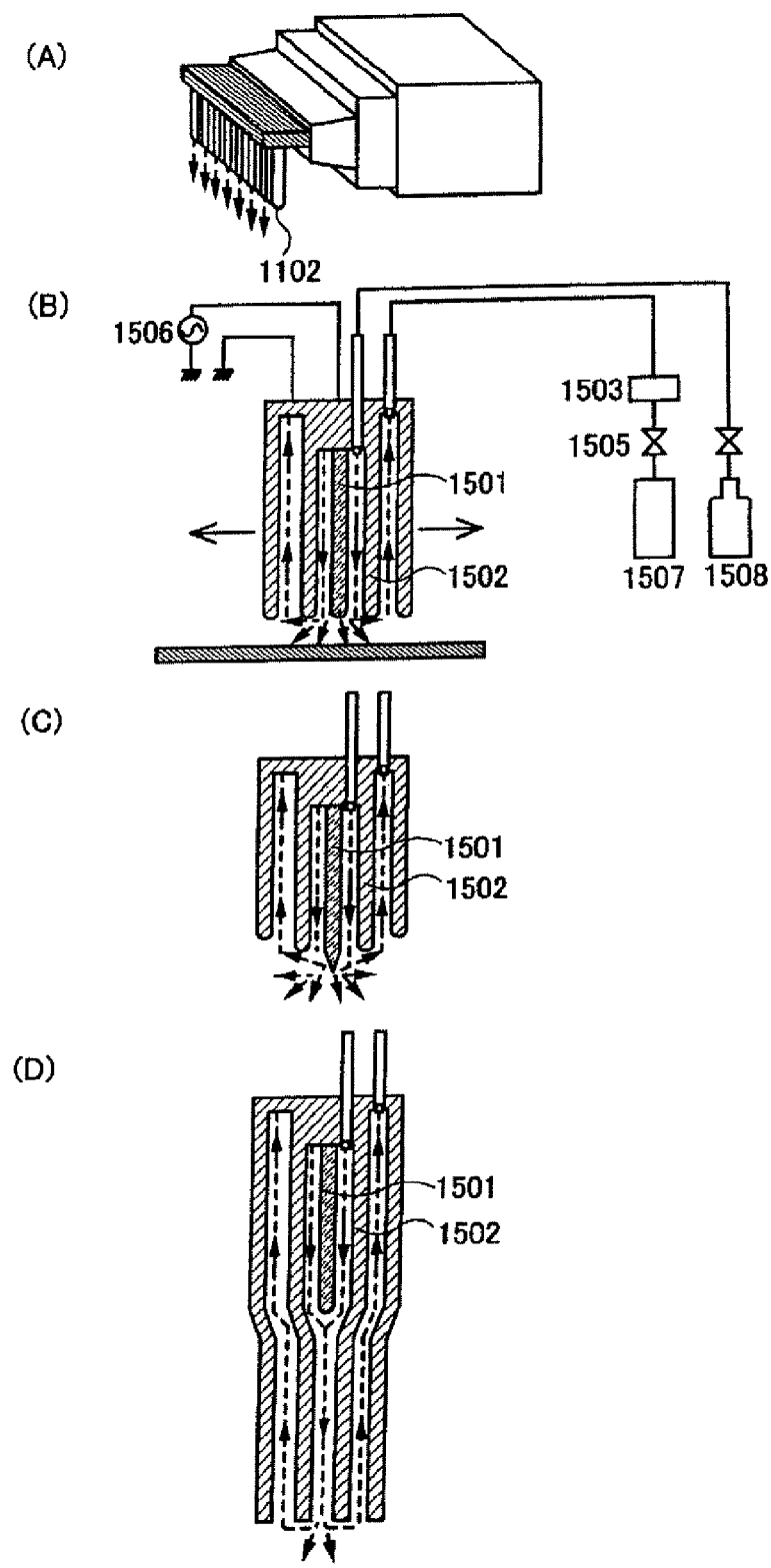
FIG. 15 is a view showing an example of the atmospheric-pressure plasma device used in implementing the invention.

An example of another configuration of the plasma generation means 1102 in the ninth embodiment is described using FIG. 15. FIG. 15(A) is a perspective view of the plasma generation means 1102 in which a plurality of cylindrical electrodes are linearly disposed, and FIG. 15(B) to FIG. 15(D) show section views of a single cylindrical plasma generation means.

In FIG. 15(B), dot lines show gas channels, and 1501, 1502 are electrodes comprising the metal having the conductivity such as aluminum and copper, and a first electrode 1501 is connected to a power source (high-frequency power source) 1506. The first electrode 1501 may be connected with the cooling system (not shown) for circulating the cooling water. If the cooling system is provided, the circulation of the cooling water prevents heating in the case of the continuous surface treatment, and improvement in efficiency can be achieved due to the continuous treatment. A second electrode 1502 has a profile surrounding periphery of the first electrode 1501, and is electrically grounded. The first electrode 1501 and the second electrode 1502 have the cylindrical pattern having the nozzle-like pore for gas on their ends. A process gas is supplied from gas supply means (gas bomb) 1508 through a valve 1505 into a space between both electrodes of the first electrode 1501 and the second electrode 1502. Thus, the atmosphere in the space is replaced, and when the high-frequency voltage (10 to 500 MHz) is applied to the first electrode 1501 from the high-frequency power source 1506 in this condition, plasma is generated in the space. Then, when the reactive gas flow containing the chemically active excited-species such as ions and radicals generated by the plasma is irradiated to the surface of the material to be processed, the predetermined surface treatment can be carried out on the surface of the material to be processed.

A type of the process gas filled in the gas supply means (gas bomb) 1508 is appropriately determined depending on the type of the surface treatment performed in the processing room. Exhaust gas 1504 is introduced into an exhaust system 1507 through a filter 1503 for removing the dust mixed into the gas and a valve 1505.

At least one of the first electrode and the second electrode needs to be covered by the solid dielectric (not shown). If the site exists, which is not covered by the solid dielectric and in which the electrodes are directly opposed to each other, the arc discharge occurs at the site. As the solid dielectric; the metal oxide such as silicon dioxide, aluminum oxide, zirconium dioxide, and titanium dioxide; plastic such as polyethylene terephthalate and polytetrafluoroethylene; glass; a composite oxide such as barium titanate; and the like are given. While the shape of the solid dielectric may be either sheet-like or film-like, its thickness is preferably 0.05 to 4 mm. The high voltage is required for generating the discharge plasma, and if the thickness is excessively small, the dielectric breakdown occurs when voltage is applied, causing the arc discharge.

Next, cylindrical plasma generation means 1102 having a different section from that in FIG. 15(B) is shown in FIG. 15(C) and FIG. 15(D). In FIG. 15(C), the first electrode 1501 is longer than the second electrode 1502, and the first electrode 1501 has the acute angle pattern, while the plasma generation means 1102 shown in FIG. 15(D) has the pattern for ejecting the plasma generated between the first electrode 1501 and the second electrode 1502 to the outside.

The cylindrical plasma generation means, which are arranged linearly and innumerably, can generate the plasma individually by computer control and the like. This makes it possible to form a linear plasma region, in addition, generate the plasma selectively.

Furthermore, by linearly arranging the cylindrical plasma generation means, the etching or the ashing is selectively carried out, thereby the amount of the gas used can be also reduced, and reduction of the production cost is impossible.

Moreover, the etching or the ashing is processed at the atmospheric pressure or the near-atmospheric pressure, thereby the vacuum chamber and pump, and the like forming the device can be simplified and increase in size of the device can be prevented. In addition, the cost of the device maintenance is reduced; and during the process, the treatment, which has been conventionally performed after the chamber was evacuated into the vacuum state, can be performed at the atmospheric pressure or the near-atmospheric pressure without needing the vacuum evacuation, and therefore the process time of the substrate can be reduced.

(Eleventh Embodiment)

In the embodiments of the invention, a distance between the gas ejection port and the substrate is 3 mm or less, preferably 1 mm or less, and more preferably 0.5 mm or less. A non-contact distance sensor and the like may be used to control the distance between the surface of the substrate to be processed and the gas ejection port.

(Twelfth Embodiment)

In the ninth embodiment and the tenth embodiment, a once-used source gas and the like may be collected and reused through a refiner and the like.

(Thirteenth Embodiment)

In the embodiments of the invention, the following method may be used for the method for forming the wiring.

Various materials such as glass, quartz, semiconductor, plastic, metal, glass epoxy resin, and ceramics may be formed into a substrate 1300. Then, a composite having microparticles, nanoparticles, and known conductive particles is ejected on the substrate 1300 using the ejection head 1301, and thereby wiring 1302, 1303 are formed (FIG. 13(A)).

Then, the substrate, on which the wiring 1302, 1303 are formed, is subjected to the heating treatment and the like, if necessary, and thereby solvent in the composite is volatized in order to increase viscosity of the composite. The heating treatment can be performed for each formation of the thin film using the solution ejection method, or performed at each of optional processes, or performed collectively after all processes have been completed.

Figure 13:
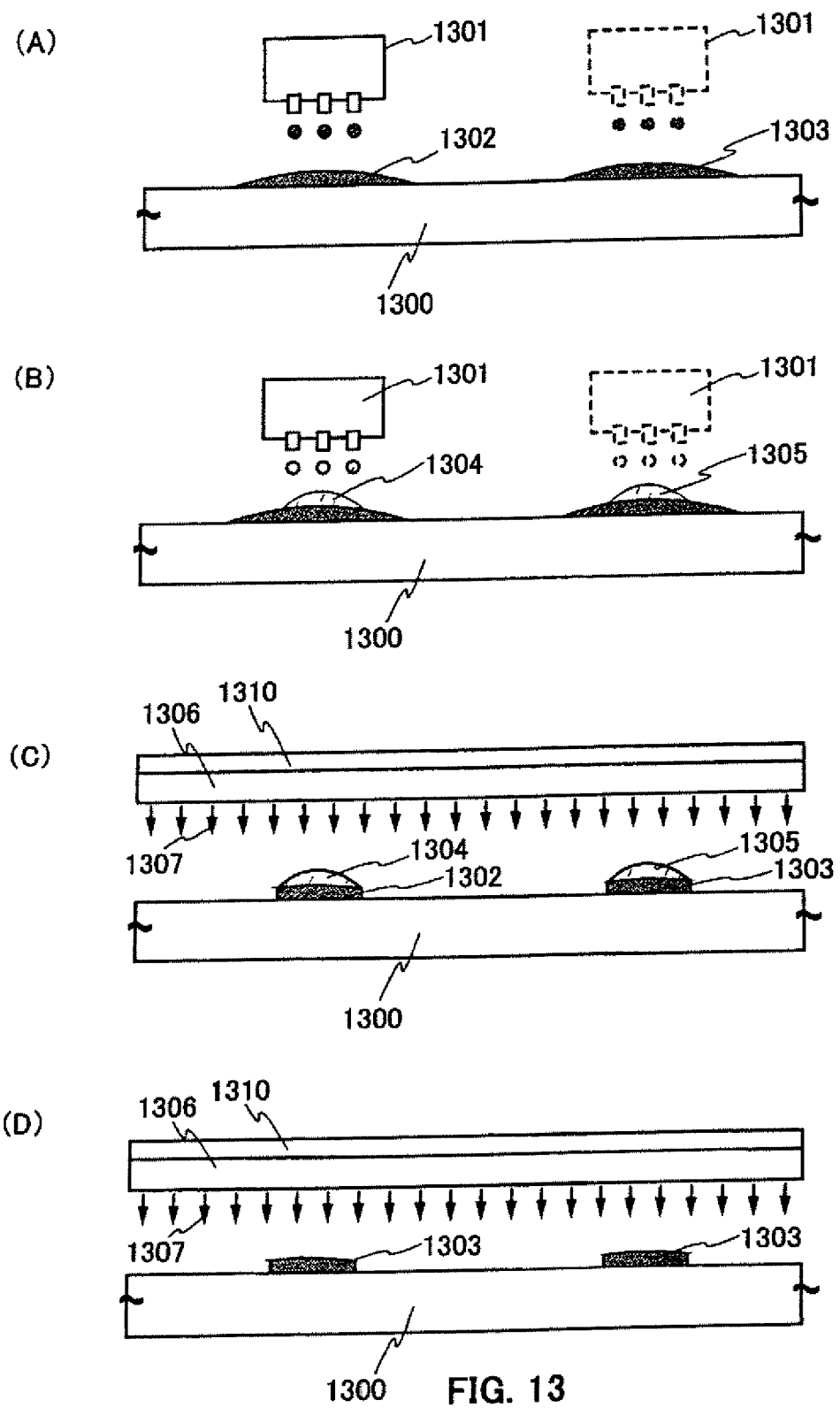
FIG. 13 is a view showing a method for producing wiring of the invention.

Then, resists 1304, 1305 are ejected on the wiring 1302, 1303 using the solution ejection method (FIG. 13(B)).

Then, the wiring 1302, 1303 are etched using the resists 1304, 1305 as a mask by means of linear plasma generation means 1306 and the base 1310 (FIG. 13(C)).

Then, the resists 1304, 1305 are removed using the ashing by means of the linear plasma generation means 1306 and the base 1310 (FIG. 13(D)).

In this way, when the wiring is formed using the solution ejection method, the resist pattern is directly formed using the solution ejection method without using a known photolithography process, and thereby the photolithography process and the amount of the resist used can be reduced. Also, the wiring is directly formed using the solution ejection method, and thereby the amount of the resist used and etching process of the wiring material can be reduced.

By using such a method for forming the wiring, number of photomasks, which have been conventionally used in respective processes, can be significantly reduced.

(Fourteenth Embodiment)

Also, in the embodiments of the invention, the following method may be used for the method for forming the wiring and the like.

Various materials such as glass, quartz, semiconductor, plastic, metal, glass epoxy resin, and ceramics may be formed into a substrate 1600. Then, the composite having the microparticles, nanoparticles, and known conductive particles is ejected on the substrate 1600 using solution ejection means 1601, and thereby wiring 1602, 1603 are formed (FIG. 16(A)).

Then, the substrate, on which the wiring 1602, 1603 are formed, is subjected to the heating treatment and the like, if necessary, and thereby the solvent in the composite is volatized to increase the viscosity of the composite. The heating treatment can be performed for each formation of the thin film using the solution ejection method, or performed at each of the optional processes, or performed collectively after all processes have been completed.

Figure 16:
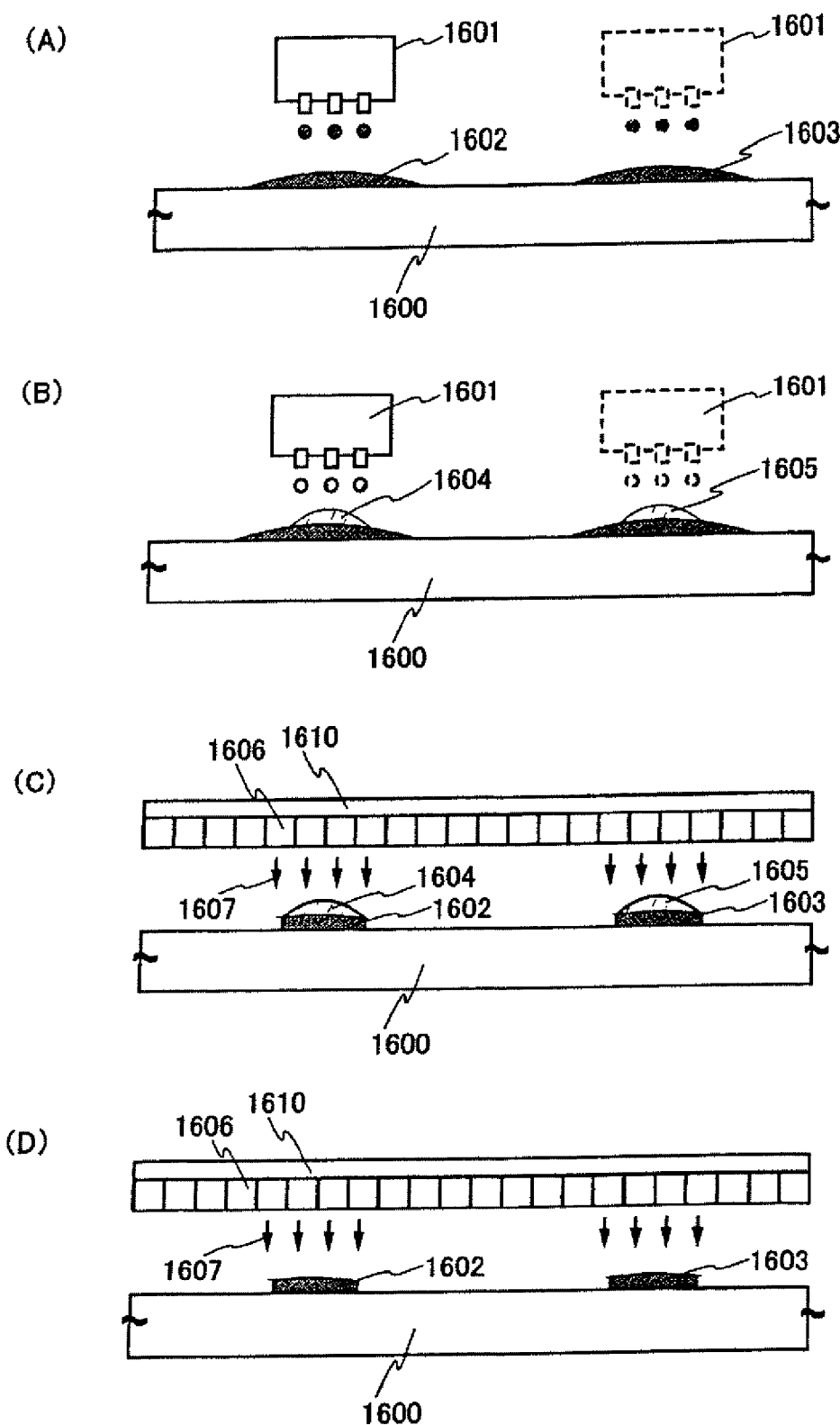
FIG. 16 is a view showing a method for producing the wiring of the invention.
Figure 17:
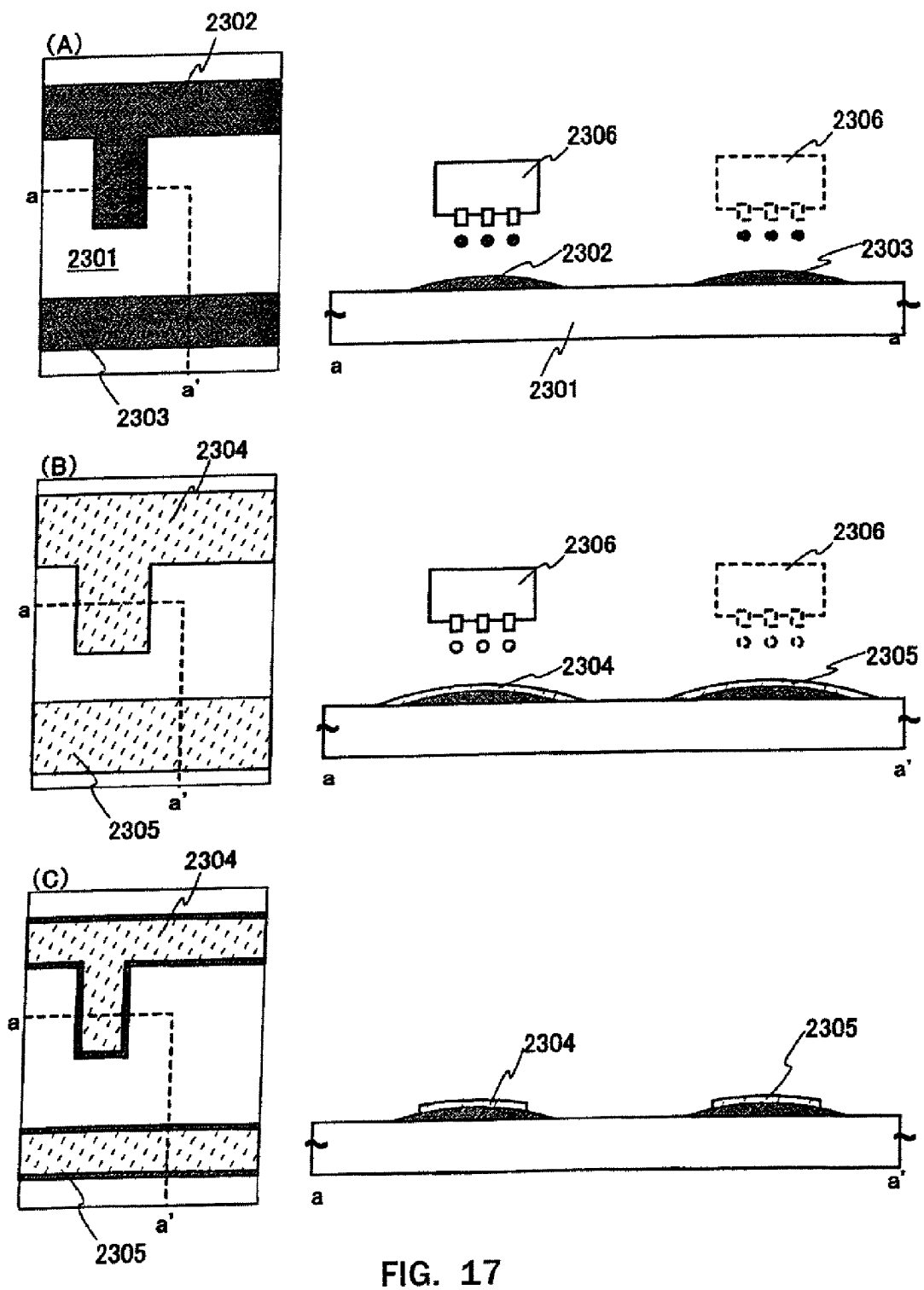
FIG. 17 is a view showing a method for producing the thin-film transistor of the invention.

Then, resists 1604, 1605 are ejected on the wiring 1602, 1603 using the solution spray method (FIG. 16(B)).

Then, the wiring 1602, 1603 are etched using the resists 1604, 1605 as a mask using plasma 1607 selectively generated by means of a plurality of linearly-arranged, cylindrical plasma-generation-means 1606 and the base 1610 (FIG. 16(C)), Then, the resists 1604, 1605 are removed by the ashing using the plasma 1607 selectively generated by means of the plurality of linearly-arranged, cylindrical plasma generation means 1606 and the base 1610 (FIG. 16(D)).

In this way, when the wiring is formed by the solution ejection method, the resist pattern is directly formed using the solution ejection method without using the known photolithography process, and thereby the photolithography process and the amount of the resist used can be reduced. Furthermore, a pattern of the wiring and the like is directly formed using the solution ejection method, and thereby nonuse of the resist and reduction of the etching process of the wiring material are possible.

By using such a method for forming the wiring, number of photomasks, which have been conventionally used in respective processes, can be significantly reduced.

(Fifteenth Embodiment)

To form the wiring pattern of the invention, a composite in which metal particles are dispersed in an organic solvent is used. The metal particles having an average particle diameter of 1 to 50 nm, and preferably 3 to 7 nm, are used. Typically, the particle is silver or gold particle, the surface of which is coated with a dispersant such as amine, alcohol, and thiol. As the organic solvent, which is phenol resin, epoxy resin, and the like, thermosetting or photo-curing one is used. Viscosity control of the composite can be performed by adding a thixotropic agent or a diluent solvent.

In the composite adequately discharged on a surface for pattern formation using the solution ejection means, the organic solvent is cured by heating or light irradiation. The metal particles contact to each together due to contraction in volume accompanied with the curing of the organic solvent, and fusion, welding, or aggregation among them is accelerated. Thus, wiring in which metal particles having the average particle diameter of 1 to 50 nm, and preferably 3 to 7 nm, are fused, welded, or aggregated is formed. In this way, a surface-contact condition among the metal particles is produced by the fusion, welding, or aggregation, thereby decrease in resistance of the wiring can be realized.

In the invention, by forming a conductive pattern using such a composite, a wiring pattern about 1 to 10 μm in line width is easily formed. Also, even if a diameter of the contact hole is about 1 to 10 μm, the composite can be filled in the hole. Thus, a multilayer wiring structure with a fine wiring pattern can be formed.

The composite shown in the embodiment can be applied to any of the first to fifteenth embodiments.

(Sixteenth Embodiment)

Figure 14:
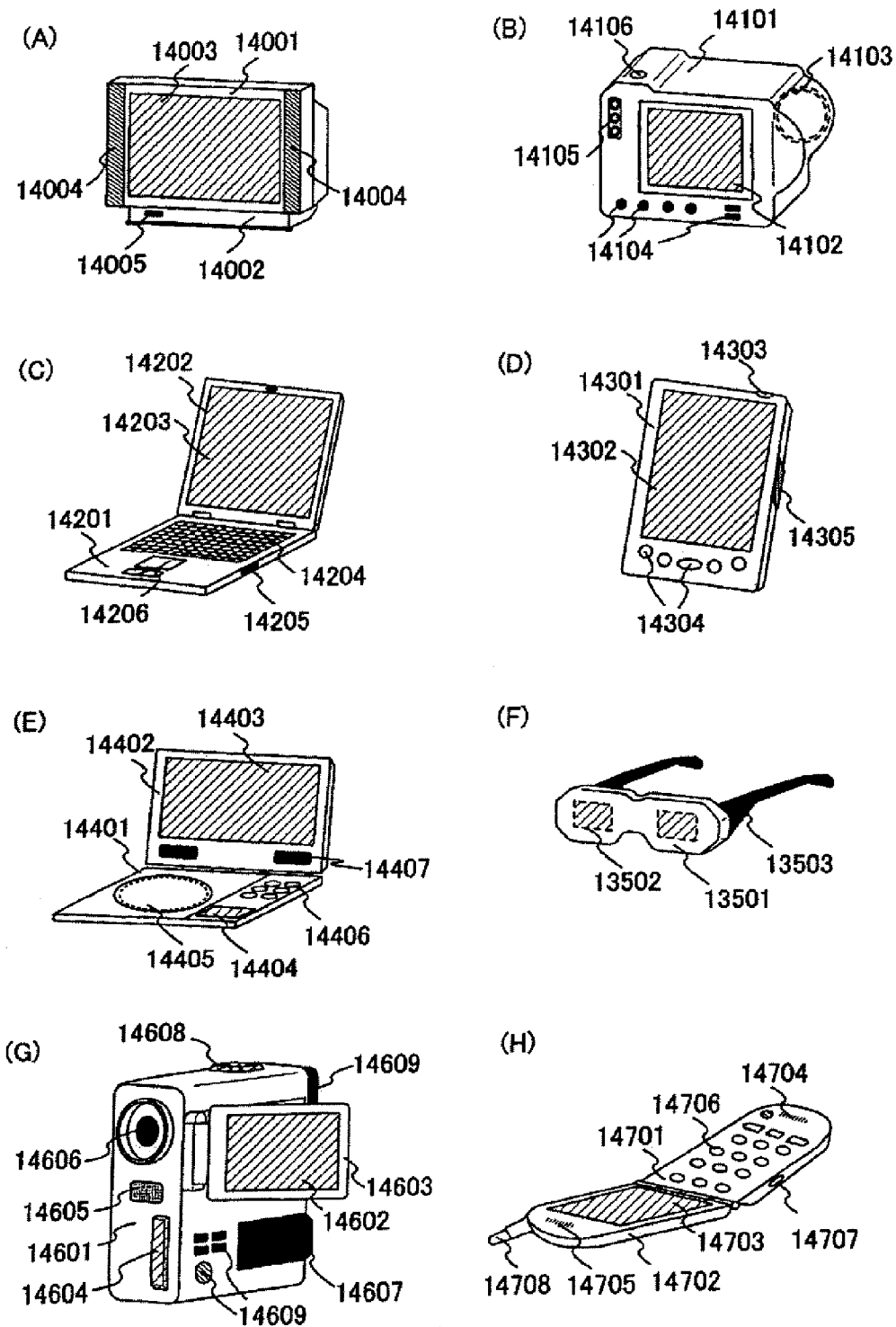
FIG. 14 is a view showing an example of an electronic instrument.

Next, as electronic instruments using the invention, a video camera, a digital camera, a goggle type display (head mount display), a navigation system, an audio reproduction device (car audio, audio components, and the like), a notebook-size personal computer, a game machine, a personal digital assistance (mobile computer, cellular phone, portable game machine, or electronic book, or the like), an image reproduction device having a recording medium (specifically, a device reproducing a recording medium such as Digital Versatile Disc (DVD) and the like and having a display that may display the image) are given. Specific examples of the electronic instruments are shown in FIG. 14.

FIG. 14(A) shows a display device comprising a chassis 14001, base 14002, display 14003, speaker 14004, video input terminal 14005, and the like. The invention can be used for an electric circuit forming the display 14003. According to the invention, the display device shown in FIG. 14(A) is completed. The display device includes all display devices for information display such as for personal computer, for TV broadcast reception 20 to 80 inches in size, and for advertisement display.

FIG. 14(B) shows a digital still camera comprising a body 14101, a display 14102, an image receiver 14103, an operation key 14104, an external connection port 14105, a shutter 14106, and the like. The invention can be used for an electric circuit forming the display 14102. According to the invention, the digital still camera shown in FIG. 14(B) is completed.

FIG. 14(C) shows a notebook-size personal computer comprising a body 14201, a chassis 14202, a display 14203, a keyboard 14204, an external connection port 14205, a pointing mouse 14206, and the like. The invention can be used for an electric circuit forming the display 14203. According to the invention, the notebook-size personal computer shown in FIG. 14(C) is completed.

FIG. 14(D) shows a mobile computer comprising a body 14301, a display 14302, a switch 14303, an operation key 14304, an IR port 14305, and the like. The invention can be used for an electric circuit forming the display 14302. According to the invention, the mobile computer shown in FIG. 14(D) is completed.

FIG. 14(E) shows a portable image reproduction device having the recording medium (specifically, DVD reproduction device) comprising a body 14401, a chassis 14402, a display A 14403, a display B 14404, a reader of the recording medium (DVD and the like) 14405, an operation key 14406, a speaker 14407, and the like. The display A 14403 mainly displays image information, and the display B 14404 mainly displays textual information, and the invention can be used for an electric circuit forming the display A, B 14403, 14404. The image reproduction device having the recording medium includes a home-use game machine. According to the invention, the DVD reproduction device shown in FIG. 14(E) is completed.

FIG. 14(F) shows a goggle type display (head mount display) comprising a body 14501, a display 14502, an arm 14503. The invention can be used for an electric circuit forming the display 14502. According to the invention, the goggle type display shown in FIG. 14(F) is completed.

FIG. 14(G) shows a video camera comprising a body 14601, a display 14602, a chassis 14603, an external connection port 14604, a remote control receiver 14605, an image receiver 14606, a battery 14607, a voice input 14608, an operation key 14609, and the like. The invention can be used for an electric circuit forming the display 14602. According to the invention, the video camera shown in FIG. 14(G) is completed.

FIG. 14(H) shows a cellular phone comprising a body 14701, a chassis 14702, a display 14703, a voice input 14704, a voice output 14705, an operation key 14706, an external connection port 14707, an antenna 14708, and the like. The invention can be used for an electric circuit forming the display 14703. In the display 14703, consumption current in the cellular phone can be suppressed by displaying a white-letter on black background. According to the invention, the cellular phone shown in FIG. 14(H) is completed.

As above, the invention can be widely applied, and used in the electronic instruments in any fields. Moreover, the electronic instruments shown herein can employ any configuration of semiconductor devices shown in the invention.

What is claimed:

1. A method for producing a display device comprising:
   forming a wiring by ejecting a first solution comprising a conductive material using a first solution ejector having solution ejection ports with moving the first solution ejector; and
   etching the wiring using a plasma device having a linear plasma generator by generating plasma between a first electrode of the linear plasma generator and a second electrode surrounding the first electrode of the linear plasma generator at an atmospheric pressure or near-atmospheric pressure,
   wherein at least the first electrode has a sheet-like shape.

2. The method for producing the display device according to claim 1, further comprising a step of forming a resist mask by ejecting a second solution comprising a resist material on the wiring using a second solution ejector having solution ejection ports with moving the second solution ejector before etching the wiring.

3. The method for producing the display device according to claim 1, wherein when the first solution is ejected using the first solution ejector, a substrate is heated.

4. The method for producing the display device according to claim 1, wherein the solution ejection ports are arranged in a cluster-pattern.

5. The method for producing the display device according to claim 2, further comprising a step of ashing the resist mask by the plasma device.

6. The method for producing the display device according to claim 2, wherein when the second solution is ejected using the second solution ejector, a substrate is heated.

7. The method for producing the display device according to claim 1, wherein the solution ejection ports of the first solution ejector includes at least three ejection ports forming a triangle.

8. A method for producing a display device comprising:
   forming a wiring by ejecting a first solution comprising a conductive material using a first solution ejector having solution ejection ports with moving the first solution ejector,
   forming a resist mask on the wiring; and
   etching the wiring using a plasma device having a linear plasma generator using the resist mask as a mask by generating plasma between a first electrode of the linear plasma generator and a second electrode surrounding the first electrode of the linear plasma generator at an atmospheric pressure or near-atmospheric pressure,
   wherein at least the first electrode has a sheet-like shape.

9. The method for producing the display device according to claim 8, wherein the resist mask is formed by ejecting a second solution on the wiring using a second solution ejector having solution ejection ports.

10. The method for producing the display device according to claim 8, wherein when the first solution is ejected using the first solution ejector, a substrate is heated.

11. The method for producing the display device according to claim 8, wherein the solution ejection ports are arranged in a cluster-pattern.

12. The method for producing the display device according to claim 8, further comprising a step of ashing the resist mask by the plasma device.

13. The method for producing the display device according to claim 9, wherein when the second solution is ejected using the second solution ejector, a substrate is heated.

14. The method for producing the display device according to claim 8, wherein the solution ejection ports of the first solution ejector includes at least three ejection ports forming a triangle.

* * * * *